(12) United States Patent
McLaren

(10) Patent No.: US 10,630,242 B2
(45) Date of Patent: *Apr. 21, 2020

(54) DOHERTY AMPLIFIERS WITH PASSIVE PHASE COMPENSATION CIRCUITS

(71) Applicant: NXP USA, Inc., Austin, TX (US)

(72) Inventor: Roy McLaren, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/264,261

(22) Filed: Jan. 31, 2019

(65) Prior Publication Data

US 2019/0165740 A1 May 30, 2019

Related U.S. Application Data

(63) Continuation-in-part of application No. 15/394,645, filed on Dec. 29, 2016, now Pat. No. 10,211,785.

(51) Int. Cl.
*H03F 1/02* (2006.01)
*H03F 1/56* (2006.01)
(Continued)

(52) U.S. Cl.
CPC ............ *H03F 1/0288* (2013.01); *H03F 1/56* (2013.01); *H03F 3/195* (2013.01); *H03F 3/245* (2013.01);
(Continued)

(58) Field of Classification Search
USPC ................................ 330/295, 124 R, 84, 286
See application file for complete search history.

(56) References Cited

U.S. PATENT DOCUMENTS

| 7,295,074 | B2 | 11/2007 | Wong et al. | |
|---|---|---|---|---|
| 8,274,332 | B2 * | 9/2012 | Cho | H03F 1/0261 330/295 |
| 8,305,141 | B2 * | 11/2012 | Jeong | H03F 1/0288 330/124 R |

FOREIGN PATENT DOCUMENTS

| EP | 3 093 987 A1 | 11/2016 |
|---|---|---|
| WO | WO-2014/068351 A2 | 5/2014 |

OTHER PUBLICATIONS

He, Jingchu; "Wideband High Power Doherty Amplifiers"; Thesis, Master of Science, Delft University of Technology; 97 pages (Sep. 30, 2014).

(Continued)

*Primary Examiner* — Hieu P Nguyen
(74) *Attorney, Agent, or Firm* — Sherry W. Schumm

(57) ABSTRACT

A Doherty amplifier has a first amplifier path that includes a first amplifier, a second amplifier path that includes a second amplifier, a power divider, and a short-circuited stub. The power divider receives an RF signal and divides the RF signal into first and second input signals. The power divider includes first and second power divider outputs that produce the first and second input signals, respectively. The short-circuited stub is coupled between the first power divider output and the first amplifier or between the second power divider output and the second amplifier. The first and second amplifier paths are characterized by first and second frequency-dependent insertion phases, respectively. A slope of the first or second frequency-dependent insertion phase is altered by the short-circuited stub. The power divider produces the first and second input signals with a quadrature phase shift.

20 Claims, 11 Drawing Sheets

(51) Int. Cl.
- H03F 3/195 (2006.01)
- H03F 3/60 (2006.01)
- H03F 3/24 (2006.01)

(52) U.S. Cl.
CPC ....... H03F 3/604 (2013.01); *H03F 2200/198* (2013.01); *H03F 2200/222* (2013.01); *H03F 2200/387* (2013.01)

(56) References Cited

OTHER PUBLICATIONS

Piazzon, Luca et al; "A Method for Designing Broadband Doherty Power Amplifier"; Progress in Electromagnetic Research, vol. 145; pp. 319-331 (Apr. 2014).

Sneijers, Walter; "Doherty architectures in UHF White Paper"; Ampleon; 14 pages (Aug. 2016).

Wong, James et al; "Doherty Amplifier Combines High Power and Efficiency"; Microwaves & RF, retrieved from the Internet https://www.mwrf.com/materials/doherty-amplifier-combines-high-power-and-efficiency ; 5 pages (Jun. 2017).

* cited by examiner

DOHERTY AMPLIFIERS WITH PASSIVE PHASE COMPENSATION CIRCUITS

RELATED APPLICATION

This application is a continuation-in-part of co-pending, U.S. patent application Ser. No. 15/394,645, filed on Dec. 29, 2016.

TECHNICAL FIELD

Embodiments of the subject matter described herein relate generally to Doherty amplifiers.

BACKGROUND

In telecommunications systems that are designed to handle signals with high peak-to-average power ratios (PAPR), Doherty power amplifier architectures have become popular due to their relatively high linearity and efficiency at back-off levels, when compared with other types of amplifier topologies. A conventional two-way Doherty power amplifier includes a class-AB biased main (or "main") amplifier and a class-C biased peaking amplifier in a parallel arrangement. When an input signal has relatively low to moderate power, the main amplifier operates to amplify the input signal, and the peaking amplifier is minimally conducting (e.g., the peaking amplifier essentially is in an off state). During this phase of operation, an impedance transformer in the output combiner network determines the maximum VSWR (voltage standing wave ratio) to which the main amplifier will be exposed. Conversely, as the input signal power increases to a level at which the main amplifier reaches voltage saturation, the input signal is split (e.g., using a 3- or other decibel (dB) power splitter) between the main and peaking amplifier paths, and both amplifiers operate to amplify their respective portion of the input signal. Ultimately, the amplified signals are combined at a summing node to produce the final amplified output signal. It is important that phase coherency of the main and peaking RF signals is present when the signals reach the summing node, so that the main and peaking RF signals may combine in phase.

As the Doherty amplifier input signal level increases beyond the point at which the main amplifier is operating in compression, the peaking amplifier conduction also increases, thus supplying more current to the load. In response, the load line impedance of the main amplifier output decreases. In fact, an impedance modulation effect occurs in which the load line of the main amplifier changes dynamically in response to the input signal power (i.e., the peaking amplifier provides active load pulling to the main amplifier). An impedance inverter, which is coupled between the output of the main amplifier and the summing node, ensures that the main amplifier sees a high value load line impedance at backoff, allowing the main amplifier to efficiently supply power to the load over an extended output power range.

According to the operating principles of a Doherty amplifier, the impedance inverter in the main path should establish the correct load modulation characteristic. The impedance inverter has an electrical length of 90 degrees at the band center frequency, fo, and an associated group delay. Unfortunately, RF bandwidth limitations associated with differences in group delay in the main and peaking output paths may result in a loss, at frequencies other than fo, of phase coherency between the main and peaking currents received at the summing node. This loss of phase coherency may result in dispersion of the load impedances seen by the main and peaking amplifiers, along with a non-ideal load modulation over frequency. The primary outcome of operating with non-ideal load modulation is a loss of peak power capability over the full band of operation, or an effective reduction in the utilization of the Doherty power amplifier. This, in turn, may impact attainable efficiency performance for a fixed output power back-off level.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

An embodiment of the inventive subject matter includes a Doherty amplifier with one or more passive phase and delay compensation circuits in either or both of the main and peaking input paths of the Doherty amplifier. As will be discussed in more detail below, each phase and delay compensation circuit may be implemented as a purely passive circuit that includes one or more transmission line based series delay elements and one or more shunt 90 degree short-circuit stub elements.

The passive phase and delay compensation circuit embodiments described herein may deliver a wider range of compensation than may be possible with a simple transmission line based series delay element, as is typically implemented in some conventional Doherty amplifier topologies. Specifically, the compensation circuit(s) may result in an over-compensation or an under-compensation of the difference between the main and peaking amplifier path group delays. As will be explained in more detail later, this may result in beneficial modifications of the wideband load impedance dispersion and load modulation characteristics to maximize utilization of the Doherty power amplifier in the full power region. This, in turn, may enable higher efficiency operation at a fixed output power back-off level.

The compensation circuit embodiments discussed herein correct, negate, and equalize the group delay response of an output circuit, and also may optimize the load impedance dispersion characteristics of the main and peaking amplifiers in the full power region in which the peaking device is active. The compensation circuit embodiments may be specifically designed to reduce peak power dispersion. In addition, the compensation circuit embodiments may maximize utilization of a Doherty power amplifier in the full power region, while also enabling higher efficiency operation at a fixed output power back-off level.

The compensation circuit embodiments described herein may have improved power handling capability over other input circuits that may use lumped LCR (inductor/capacitor/resistor) elements. In addition, the overall circuit losses may be reduced, when compared with Doherty amplifiers that do not include embodiments of the compensation circuits. Further, the compensation circuit embodiments may be implemented without the use of an active control circuit, thereby avoiding the additional cost, complexity, and bandwidth limitation that may be associated with such an active control circuit.

Figure 1:
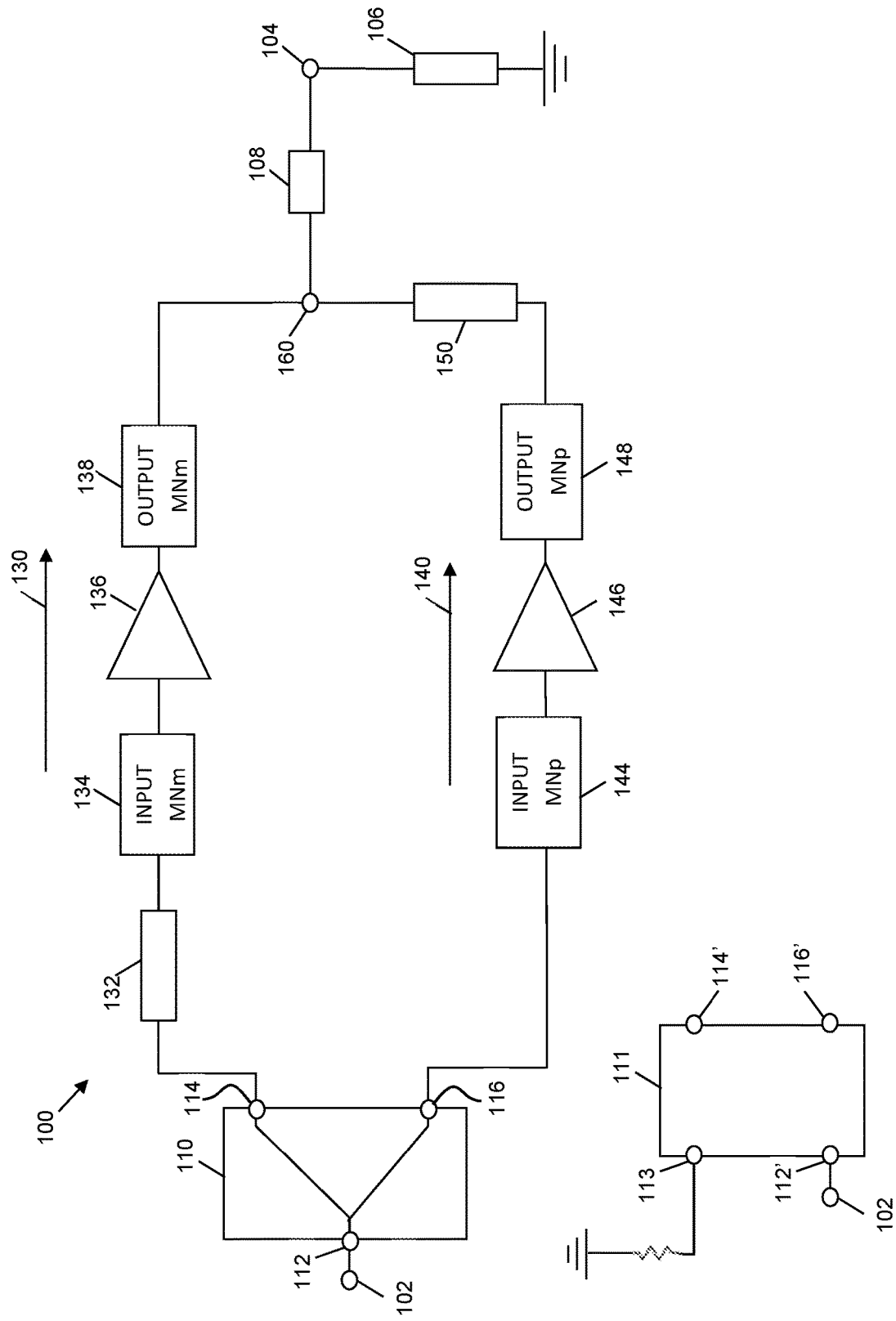
FIG. 1 is a simplified schematic diagram of a conventional Doherty amplifier.

FIG. 1 is a simplified schematic diagram of a conventional Doherty amplifier 100. Amplifier 100 includes an input node 102, an output node 104, a power divider 110 (or splitter), a main amplifier path 130, a peaking amplifier path 140, and a combining node 160. A load 106 may be coupled to the combining node 160 through an impedance transformer 108 in an embodiment. The impedance transformer 108 may impart a 90 degree phase delay to the output RF signal before it is supplied to the load 106.

Essentially, the power divider 110 divides an input RF signal supplied at the input node 102, and the divided signals are separately amplified along the main and peaking amplifier paths 130, 140. The amplified signals are then combined in phase at the combining node 160. It is important that phase coherency between the main and peaking amplifier paths 130, 140 is maintained across a frequency band of interest to ensure that the amplified main and peaking signals arrive in phase at the combining node 160, and thus to ensure proper Doherty amplifier operation.

Each of the main amplifier 136 and the peaking amplifier 146 includes one or more single stage or multiple-stage power transistor integrated circuits (ICs) for amplifying an RF signal conducted through the amplifier 136, 146. Although the main and peaking power transistor ICs may be of equal size (e.g., in a symmetric Doherty configuration), the main and peaking power transistor ICs may have unequal sizes, as well (e.g., in various asymmetric Doherty configurations). In an asymmetric Doherty configuration, the peaking power transistor IC(s) typically are larger than the main power transistor IC(s) by some multiplier. For example, the peaking power transistor IC(s) may be twice the size of the main power transistor IC(s) so that the peaking power transistor IC(s) have twice the current carrying capability of the main power transistor IC(s). Peaking-to-main amplifier IC size ratios other than a 2:1 ratio may be implemented, as well.

During operation of Doherty amplifier 100, main amplifier stage 136 is biased to operate in class AB mode, and peaking amplifier stage 146 is biased to operate in class C mode. More specifically, the transistor arrangement of main amplifier stage 136 is biased to provide a conduction angle between 180 and 360 degrees. Conversely, the transistor arrangement of the peaking amplifier stage 146 is biased to provide a conduction angle less than 180 degrees.

At low power levels, where the power of the input signal at node 102 is lower than the turn-on threshold level of peaking amplifier 146, the amplifier 100 operates in a low-power (or back-off) mode in which the main amplifier 136 is the only amplifier supplying current to the load 106. When the power of the input signal exceeds a threshold level of the peaking amplifier 146, the amplifier 100 operates in a high-power mode in which the main amplifier 136 and the peaking amplifier 146 both supply current to the load 106. At this point, the peaking amplifier 146 provides active load modulation at combining node 160, allowing the current of the main amplifier 136 to continue to increase linearly.

Input and output impedance matching networks 134, 138 (input MNm, output MNm) may be implemented at the input and/or output of the main amplifier 136. Similarly, input and output impedance matching networks 144, 148 (input MNp, output MNp) may be implemented at the input and/or output of the peaking amplifier 146. In each case, the matching networks 134, 138, 144, 148 may be used to incrementally increase the circuit impedance toward the load impedance and source impedance. In addition, the main amplifier 136 and the peaking amplifier 146 may have additional pre-matching input and/or output impedance matching networks (not illustrated in FIG. 1) that are either integrated with the power transistor dies, or integrated within the power transistor die packages.

Doherty amplifier 100 has an "inverted" load network configuration, as compared to a conventional non-inverted Doherty amplifier. In the inverted configuration, the input circuit is configured so that an input signal supplied to the main amplifier 136 is delayed by 90 degrees with respect to the input signal supplied to the peaking amplifier 146 at the center frequency of operation, fo, of the amplifier 100. As will be discussed in more detail below, the 90 degree differential delay in the input circuit between the main and peaking paths 130, 140 may be imparted by a 90 degree phase delay element 132 in the main amplifier path 130. Alternatively, the power divider 110 and the phase delay element 132 may be replaced with a hybrid power splitter 111, which outputs main and peaking signals with the desired 90 degree phase difference.

Conventionally, the industry terminology "hybrid power splitter" or "hybrid power divider" implies a coupler circuit that imparts an equal power split ratio (3 decibel (dB) coupling factor) at the output nodes, whilst also providing a broadband phase shift between the output nodes. A hybrid power splitter may impart a relative phase shift of 90 degrees between the signals produced at the output nodes, for example, or a hybrid power splitter may impart a relative phase shift of 180 degrees or some other phase shift value to the signals produced at the output nodes. As used herein, the term "hybrid power splitter" (or "hybrid power divider") is defined as a class of power divider circuit that imparts a broadband, approximately 90 degree phase shift between output nodes, and which further may impart any suitable output signal power split ratio (e.g., coupling factors including, but not limited to, a range from 2 dB to 10 dB, including for example 2 dB, 3 dB, 5 dB, 6 dB, etc.). For example, a known class of power divider in high power amplifier designs is a backward-wave transmission line-based coupler that imparts a broadband, near constant 90 degree phase shift over frequency. Anaren is a company that is a major global supplier of such components used in the industry. Therefore, the description herein may also refer to an "Anaren-type hybrid power divider/splitter" to describe this class of power splitter, as would be appreciated by those skilled in the art based on the description herein. However, it should be noted that the inventive subject matter disclosed herein is not limited to use of Anaren-type hybrid power dividers/splitters, and other suitable power dividers/splitters alternatively may be used.

Power divider 110 is configured to divide the input power of an input signal 102 received at power splitter input 112 into main and peaking portions of the input signal. The main input signal is provided to the main amplifier path 130 at power divider output 114, and the peaking input signal is provided to the peaking amplifier path 140 at power divider output 116. During operation in a full-power mode when both the main and peaking amplifiers 136, 146 are supplying current to the load 106, the power divider 110 divides the input signal power between the amplifier paths 130, 140. For example, the power divider 110 may divide the power equally, such that roughly one half of the input signal power is provided to each path 130, 140 (e.g., for a symmetric Doherty amplifier configuration). Alternatively, the power divider 110 may divide the power unequally (e.g., for an asymmetric Doherty amplifier configuration).

In some conventional systems, the power divider 110 may be implemented as a Wilkinson-type divider. At the center frequency of operation of amplifier 100, a suitable Wilkinson-type divider has the characteristic that it outputs the main and peaking input RF signals at outputs 114, 116 with about zero degrees of phase difference between the signals (although the main and peaking signals at outputs 114, 116 lag the input RF signal at input 112 by about 90 degrees). To ensure that the main and peaking input RF signals arrive at the main and peaking amplifiers 136, 146 with about 90 degrees of phase difference, as is fundamental to proper Doherty amplifier operation, phase delay element 132 applies about 90 degrees of phase delay to the main input signal. For example, phase delay element 132 may be a quarter wave transmission line, or another suitable type of delay element with an electrical length of about 90 degrees.

In other conventional systems, power divider 110 and phase delay element 132 may be replaced with hybrid power splitter 111 (which, according to the definition above, may include a backward-wave coupler, a 2 dB splitter, a 3 dB splitter, a 5 dB splitter, and so on), which includes input 112' coupled to the input signal node 102, a terminated port 113 (e.g., terminated with 50 ohms), and splitter outputs 114', 116'. Hybrid power splitter 111 receives an input RF signal through input 112', divides the signal, and outputs main and peaking input signals at splitter outputs 114', 116' with a broadband, near constant quadrature (90 degree) phase shift difference versus frequency. The hybrid power splitter 111 imparts a 90 degree phase delay to the main input signal. Therefore, delay element 132 is not needed in the amplifier 100 when hybrid power splitter 111 is included. More specifically, when terminated as illustrated in FIG. 1, hybrid power splitter 111 divides an RF signal 102 received at input 112', and the main input signal produced at output 114' has a 90 degree relative phase lag compared to the peaking input signal produced at output 116'.

In accordance with the principles of operation of the "inverted" Doherty amplifier 100 and in order to establish the correct load modulation characteristic, the main output path including output matching network (output MNm) 138 plus any output pre-match within main amplifier device 136 is configured to impart a total phase delay of about 90 degrees, and the peaking output path including a delay element 150 plus output matching network (output MNp) 148 plus any output pre-match within peaking amplifier device 146 is configured to impart a total phase delay of about 180 degrees. The main output path 130 including output matching network 138 plus any output pre-match within main amplifier device 136 is configured to impart a total phase delay of about 90 degrees to ensure that the main output path operates as an impedance inverter. Essentially, the main output path is configured to appear as a voltage source seen from the combining node 160. The delay element 150 plus output matching network 148 plus any output pre-match within peaking amplifier device 146 is configured to impart a total phase delay of about 180 degrees to ensure that the peaking output path appears as a current source seen at the combining node 160. This is also important in order to maximize the impedance looking into the peaking path output from the combining node 160 to minimize undesirable loading of the main path during low-power (or back-off) mode.

To compensate for the resulting 90 degree phase delay difference between the main and peaking amplifier paths 130, 140 at the outputs of amplifiers 136, 146 (i.e., to ensure that the amplified signals arrive in phase at the combining node 160), the input circuit is consequently configured to apply about a 90 degree phase delay to the signal at the input of main amplifier 136. However, to ensure that the amplified signals arrive in phase at the combining node 160 over a desired bandwidth, it is also important to account for the fact that the group delay of the peaking amplifier path 140 at the output of amplifier 146 is greater than the group delay of the main amplifier path 130 at the output of amplifier 136.

In a conventional Doherty amplifier 100 that includes a Wilkinson-type divider 110 and a delay element 132, the delay element 132 should be configured to ensure that the main and peaking path delays are equalized. More specifically delay element 132 compensates for an inherently longer peaking path delay in the output circuit. As will be described in more detail below, the output circuit of the peaking amplifier path 140 is about 90 degrees longer than the output circuit of the main amplifier path 130. Thus, the input circuit of the main amplifier path 130 should have a corresponding 90 degrees phase delay (i.e., delay element 132) to ensure that currents are received coherently at the output combining node 160. Delay element 132 essentially matches the main and peaking path insertion phase characteristics over frequency, and phase coherency between the main and peaking signals may be maintained through the main and peaking amplifier paths 130, 140.

Figure 4:
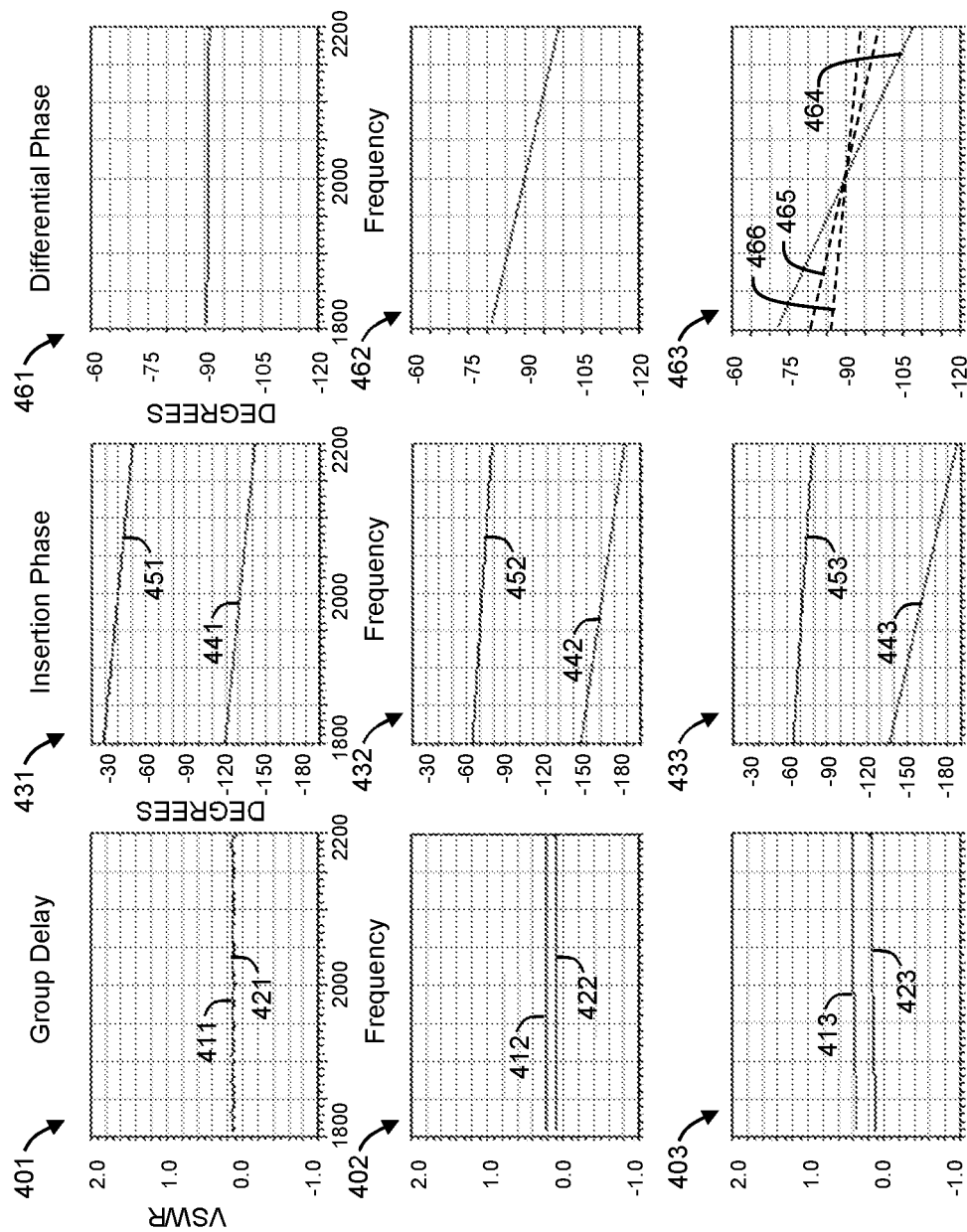
FIG. 4 includes plots illustrating group delay, insertion phase, and differential input phase for conventional Doherty amplifiers and an embodiment of a Doherty amplifier that includes a passive phase compensation circuit.

Referring briefly to FIG. 4, plot 462 illustrates a typical differential phase characteristic at the inputs to the main and peaking input matching networks 134, 144 when a Wilkinson-type power divider 110 and a 90 degree phase delay element 132 are implemented in Doherty amplifier 100. More specifically, plot 462 indicates the frequency-dependent phase differential between the main and peaking input signals over a simulated frequency range of 1800 megahertz (MHz) to 2200 MHz, with 2000 MHz corresponding to the center frequency of operation, fo. As plot 462 illustrates, the use of a Wilkinson-type power divider 110 and phase delay element 132 results in a 90 degree phase difference between the main and peaking input signals at fo, with a smaller phase difference at lower frequencies, and a larger phase difference at higher frequencies (i.e., the phase difference plot 462 has a negative slope). The slope of the phase difference plot indicates the differential group delay of the input circuit, and typically is designed to match the group delay differential associated with the main and peaking path output circuits including main and peaking amplifiers 136 and 146. Thus, a Wilkinson-type power divider 110 plus phase delay element 132 may be referred to as a "phase tracking input divider," because the combination is configured to track (or equalize) the differential group delay of the main and peaking path output circuits (including main and peaking amplifiers 136 and 146) over frequency. In other words, a conventional phase tracking input divider compensates for the difference in group delay between the main and peaking output paths. More specifically, in a conventional Doherty amplifier with a Wilkinson-type power divider 110 and phase delay element 132, the slope of the phase difference plot (e.g., plot 462) would be substantially equal to the slope of the differential phase of the entire main and peaking path output circuits (including main and peaking amplifiers 136 and 146).

As used herein, an "input group delay" includes the cumulative delays imparted by circuitry between an input node (e.g., input node 102, 202) and an input to an amplifier (e.g., amplifier 136, 236 or 146, 246). Conversely, an "output group delay" includes the cumulative delays imparted by an amplifier (e.g., amplifier 136, 236 or 146, 246, including the active portion of the amplifier, any input and/or output parasitic elements (e.g. output capacitive element 274), any input and/or output pre-matching circuitry and external matching circuitry (e.g., including circuitry 276, 278 and 238, 248 FIGS. 2A, 2B) and any other circuitry in the amplifier output paths up to the combining node (e.g., combining node 160, 260). As used herein, a phase tracking input divider (e.g., divider 110 plus delay element 132) that "compensates" for the difference in group delay between the main and peaking output paths essentially increases the slope versus frequency of the main path insertion phase characteristic to match the slope versus frequency of the peaking path insertion phase characteristic. As used herein, the term "match," with respect to the slopes of insertion phase characteristics or differential phase characteristics means that the slopes are within 5 percent of each other.

A traditional Doherty amplifier with a Wilkinson-type divider 110 and a 90 degree phase delay element 132 may adequately equalize the path group delay, and this may secure phase coherency at the combining node 160 over a relatively wide bandwidth. However, in such a traditional Doherty amplifier, the load impedance characteristics at peak power conditions may have relatively high dispersion, as well as non-ideal load modulation over the full band of operation. The resulting loss of peak power capability over the full band of operation effectively limits the utilization of the Doherty power amplifier. This, in turn, may have significant detrimental impacts on the attainable efficiency performance for a fixed output power back-off level.

In contrast with a Wilkinson-type divider 110 plus phase delay element 132, a hybrid power splitter (e.g., splitter 111) applies a constant 90 degree differential phase shift across a wide bandwidth. Accordingly, hybrid power splitter 111 produces output signals at outputs 114' and 116' that have a 90 degree phase difference independent of frequency.

Referring again to FIG. 4, plot 461 illustrates a typical differential phase characteristic at the inputs to the main and peaking input matching networks 134, 144 when a hybrid power splitter 111 (without phase delay element 132) is implemented in Doherty amplifier 100. More specifically, plot 461 indicates the phase differential between the main and peaking signals over the simulated frequency range (e.g., 1800-2200 MHz). As plot 461 illustrates, the hybrid power splitter 111 is characterized by a very flat differential phase characteristic across a wide frequency range. Unfortunately, for many Doherty amplifier architectures, this characteristic renders the hybrid power splitter 111 suitable for use only with relatively narrow-band Doherty power amplifiers. The reason for this is that the phase shift imparted by the hybrid power splitter 111 does not track (or equalize) the differential group delay of the main and peaking path output circuits (including main and peaking amplifiers 136 and 146). Accordingly, and as the signal frequency moves away from the center frequency, fo, the phase coherency between the amplified main and peaking signals as they arrive at the combining node 160 is lost.

As mentioned above, some traditional Doherty amplifier architectures, such as the amplifier 100 in FIG. 1 with the Wilkinson-type divider 110 and 90 degree phase delay element 132, or the amplifier 110 in FIG. 1 with the hybrid power splitter 111, may experience significant dispersion of the load impedances at peak power conditions, as well as non-ideal load modulation over frequency. The resulting consequences may include peak power capability loss over the full band of operation, limited utilization of the amplifier, and significant detrimental impacts on the attainable efficiency performance for a fixed output power back-off level.

Embodiments of the inventive subject matter, which are discussed in more detail below in conjunction with FIGS. 2A, 2B, 3A, and 3B, are configured to alter the compensation for the group delay difference in a Doherty amplifier to beneficially manipulate the load impedance characteristics at peak power. This is achieved, in various embodiments, by including one or more "compensation circuits" in the input circuit of the Doherty amplifier. Implementation of the various embodiments may result in a lower load impedance dispersion than can be achieved using traditional Doherty amplifier architectures. Specifically, the various embodiments may alter the wideband load modulation characteristic, as compared with traditional Doherty architectures, to reduce the load impedance dispersion at peak power conditions. This may achieve a greater peak power bandwidth capability than is achievable using a traditional Doherty amplifier architecture, along with higher utilization of the amplifier.

Figure 2A:
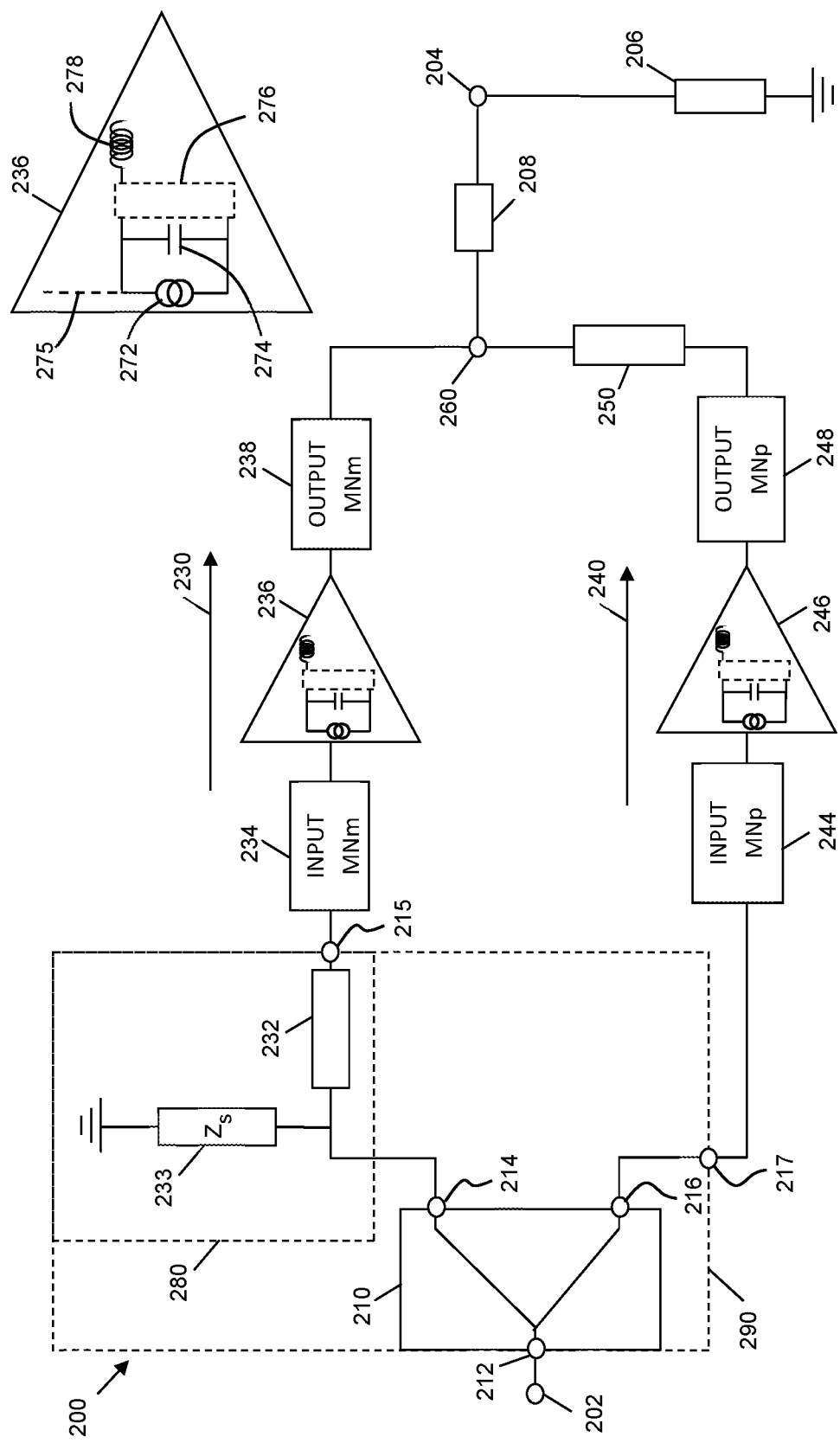
FIG. 2A is a simplified schematic diagram of a Doherty amplifier, in accordance with an embodiment.

FIG. 2A is a simplified schematic diagram of a Doherty amplifier 200, in accordance with an embodiment. The Doherty amplifier 200 of FIG. 2A also has an inverted topology, meaning that amplifier 200 has an inverted load network configuration, as compared to a more conventional non-inverted Doherty amplifier. In addition, as will be described in more detail below, Doherty amplifier 200 includes a phase and delay compensation circuit 280, which includes a series delay element 232 (e.g., a 90 degree transmission line based series delay element) and a shunt 90 degree short-circuited stub 233 in the input circuit to the main amplifier 236. The phase and delay compensation circuit 280, referred to simply as a "compensation circuit," below, functions to over-compensate for the difference between the main and peaking amplifier path group delays, in an embodiment. In an alternate embodiment, the compensation circuit 280 may function to under-compensate for the difference between the main and peaking amplifier path group delays. Either way, embodiments of compensation circuits enable a Doherty architecture potentially to achieve a lowest possible impedance dispersion at peak power (e.g., a lowest possible peak power dispersion).

Amplifier 200 generally includes an input circuit (i.e., components between an input node 202 and the amplifier inputs), an output circuit (i.e., components between the amplifier outputs and a combining node 260), and multiple parallel-coupled amplifiers 236, 246 between the input and output circuits. More specifically, amplifier 200 includes an input node 202, an output node 204, a power divider 210, a main amplifier path 230, a peaking amplifier path 240, and a combining node 260. A load 206 may be coupled to the combining node 260 through an impedance transformer 208, in an embodiment. The impedance transformer 208 may impart a 90 degree phase delay to the output RF signal before it is supplied to the load 206. Alternatively, the impedance transformer 208 may be excluded.

The power divider 210 divides an input RF signal supplied at the input node 202, and the divided signals are separately amplified along the main and peaking amplifier paths 230, 240. The amplified signals are then combined at the combining node 260. As will be explained in more detail below, inclusion of the shunt 90 degree short-circuited stub 233 alters the relative main and peaking RF signal phases to favorably alter the load impedance dispersion characteristics (e.g., to favorably alter the wideband load-modulation characteristic). Phase coherency between the main and peaking amplifier paths 230, 240 may or may not be maintained across the entire band of operation.

Each of the main amplifier 236 and the peaking amplifier 246 includes one or more single stage or multiple-stage power transistor integrated circuits (ICs) for amplifying an RF signal conducted through the amplifier 236, 246. Although the main and peaking power transistor ICs may be of equal size (e.g., in a symmetric Doherty configuration), the main and peaking power transistor ICs may have unequal sizes, as well (e.g., in various asymmetric Doherty configurations). In an asymmetric Doherty configuration, the peaking power transistor IC(s) typically are larger than the main power transistor IC(s) by some multiplier. For example, the peaking power transistor IC(s) may be twice the size of the main power transistor IC(s) so that the peaking power transistor IC(s) have twice the current carrying capability of the main power transistor IC(s). Peaking-to-main amplifier IC size ratios other than a 2:1 ratio may be implemented, as well.

During operation of Doherty amplifier 200, main amplifier stage 236 is biased to operate in class AB mode, and peaking amplifier stage 246 is biased to operate in class C mode. More specifically, the transistor arrangement of main amplifier stage 236 is biased to provide a conduction angle between 180 and 360 degrees. Conversely, the transistor arrangement of the peaking amplifier stage 246 is biased to provide a conduction angle less than 180 degrees.

At low power levels, where the power of the input signal at node 202 is lower than the turn-on threshold level of peaking amplifier 246, the amplifier 200 operates in a low-power (or back-off) mode in which the main amplifier 236 is the only amplifier supplying current to the load 206. When the power of the input signal exceeds a threshold level of the peaking amplifier 246, the amplifier 200 operates in a high-power mode in which the main amplifier 236 and the peaking amplifier 246 both supply current to the load 206.

At this point, the peaking amplifier 246 provides active load modulation at combining node 260, allowing the current of the main amplifier 236 to continue to increase linearly.

Input and output impedance matching networks 234, 238 (input MNm, output MNm) may be implemented at the input and/or output of the main amplifier 236. Similarly, input and output impedance matching networks 244, 248 (input MNp, output MNp) may be implemented at the input and/or output of the peaking amplifier 246. In each case, the matching networks 234, 238, 244, 248 may be used to incrementally increase the circuit impedance toward the load impedance and source impedance.

In addition, the main amplifier 236 and the peaking amplifier 246 may have additional pre-matching input and/or output impedance matching networks that are either integrated with the power transistor dies, or integrated within the power transistor die packages. For example, the power transistor dies may include silicon-based field effect transistors (FETs), such as laterally-diffused metal oxide semiconductor (LDMOS) FETs, gallium nitride FETs, and/or gallium arsenide FETs, to name a few. In the upper right corner of FIG. 2A, an enlarged depiction of an output circuit model of the main and peaking amplifiers 236, 246 is shown. Essentially, the output of each amplifier 236, 246 may be modeled as a current source 272 with a drain-source capacitance 274. An output impedance pre-matching circuit 276 and a series inductance 278 (e.g., series wirebonds) may be integrated with the transistor die and/or within the power transistor package. Dashed line 275 represents the intrinsic current generator reference plane, which will be mentioned below in conjunction with FIGS. 5, 8 and 9.

As with amplifier 100, Doherty amplifier 200 has an inverted load network configuration. In the inverted configuration, the input circuit is configured so that an input signal supplied to the main amplifier 236 is delayed by about 90 degrees with respect to the input signal supplied to the peaking amplifier 246 at the center frequency of operation, fo, of the amplifier 200.

Power divider 210 is configured to divide the input power of an input signal 202 received at power splitter input 212 into main and peaking portions of the input signal. The main input signal is provided to the main amplifier path 230 at power divider output 214, and the peaking input signal is provided to the peaking amplifier path 240 at power divider output 216. During operation in a full-power mode when both the main and peaking amplifiers 236, 246 are supplying current to the load 206, the power divider 210 divides the input signal power between the amplifier paths 230, 240. For example, the power divider 210 may divide the power equally, such that roughly one half of the input signal power is provided to each path 230, 240 (e.g., for a symmetric Doherty amplifier configuration). Alternatively, the power divider 210 may divide the power unequally (e.g., for an asymmetric Doherty amplifier configuration).

According to an embodiment, the power divider 210 is configured to provide equal-phase main and peaking signals at outputs 214, 216, respectively. In other words, power divider 210 has the characteristic that it outputs the main and peaking input RF signals at outputs 214, 216 with about zero degrees of phase difference between the signals (although the main and peaking signals at outputs 214, 216 lag the input RF signal at input 212 by about 90 degrees). For example, power divider 210 may be a Wilkinson-type divider, or another suitable type of divider that has the above characteristics. About a 90 degree differential delay in the input circuit between the main and peaking paths 230, 240 at fo is imparted by the phase delay element 232 in the main amplifier path 230, in an embodiment. For example, phase delay element 232 may be a quarter wave transmission line, or another suitable type of delay element with an electrical length of about 90 degrees. In various alternate embodiments, all or a portion of the series delay imparted by the phase delay element 232 may instead be provided by the power divider 210. In such alternate embodiments in which a portion of the 90 degree delay otherwise provided by delay element 232 is instead provided by the power divider 210, the electrical length of the delay element 232 may be reduced by that portion of the 90 degree delay (up to and including eliminating delay element 232 altogether).

To establish a correct load modulation characteristic, the main output path including output matching network (output MNm) 238 plus any output pre-match within main amplifier device 236 (e.g., output pre-match 276 and inductance 278) plus any output parasitic element (e.g. drain-source capacitance 274) is configured to impart a total phase delay of about 90 degrees, and the peaking output path including a delay element 250 plus output matching network (output MNp) 248 plus any output pre-match within peaking amplifier device 246 (e.g., output pre-match 276 and inductance 278) plus any output parasitic element (e.g. drain-source capacitance 274) is configured to impart a total phase delay of about 180 degrees. The main output path 230 is configured to impart a total phase delay of about 90 degrees to ensure that the main output path operates as an impedance inverter. Essentially, the main output path is configured to appear as a voltage source seen from the combining node 260. The peaking output path 240 is configured to impart a total phase delay of about 180 degrees to ensure that the peaking output path appears as a current source seen at the combining node 260. This is also important in order to maximize the impedance looking into the peaking path output from the combining node 260 to minimize undesirable loading of the main path during low-power (or back-off) mode.

To compensate for the resulting 90 degree phase delay difference between the main and peaking amplifier paths 230, 240 at the outputs of amplifiers 236, 246 (i.e., to ensure that the amplified signals arrive substantially in phase at the combining node 260), the input circuit is consequently configured to apply about a 90 degree phase delay to the signal at the input of main amplifier 236. However, to ensure that the amplified signals arrive substantially in phase at the combining node 260 over a desired bandwidth, it is also important to account for the fact that the group delay of the peaking amplifier path 240 at the output of amplifier 246 is greater than the group delay of the main amplifier path 230 at the output of amplifier 236.

Delay element 232 is configured to ensure that the main and peaking path delays are substantially equalized. More specifically delay element 232 compensates for an inherently longer peaking path delay in the output circuit. As will be described in more detail below, the output circuit of the peaking amplifier path 240 is about 90 degrees longer than the output circuit of the main amplifier path 230. Thus, the input circuit of the main amplifier path 230 should have a corresponding 90 degrees phase delay (e.g., as provided by delay element 232) to ensure that RF signals are received coherently at the output combining node 260. Delay element 232 essentially matches the main and peaking path insertion phase characteristics over frequency, and phase coherency between the main and peaking signals may be substantially maintained through the main and peaking amplifier paths 230, 240. In actuality, precise phase coherency between the main and peaking amplifier paths 230, 240 may or may not be maintained across the entire band of operation as a result of the inclusion of the 90 degree short-circuited stub 233. However, the resulting beneficial alteration of the load impedance dispersion characteristics at peak power conditions may result in improved performance, when compared with traditional Doherty amplifier architectures.

Power divider 210 plus phase delay element 232 may be referred to as a "phase tracking input divider," because the combination is configured to substantially track (or equalize) the differential group delay of the main and peaking path output circuits (including main and peaking amplifiers 236 and 246). The phase tracking input divider composed of divider 210 plus delay element 232 functions to compensate for the differential output group delay between the main and peaking path 230, 240, because the combination of divider 210 and delay element 232 may be configured to have a differential phase characteristic with a substantially equal slope as the slope of the differential phase of the main and peaking path output circuits (including main and peaking amplifiers 236 and 246). If the main and peaking amplifiers 236, 246 (including any pre-match circuitry and/or external matching circuitry), have different group delays, then a given electrical length may be added or subtracted from the electrical length of delay element 232 to compensate, in an embodiment. Alternatively, an offset delay line could be added at the input of the path with the lower delay.

According to an embodiment, a shunt 90 degree short-circuited stub 233 is included along the main input path, which functions to alter the frequency-dependent phase characteristic of the power divider 210 and delay element 232, or to alter the slope of the frequency-dependent phase characteristic of the input circuit to the main amplifier 236. In one embodiment, the shunt 90 degree short-circuited stub 233 functions to "over-compensate" for the differential group delay of the main and peaking path output circuits (including main and peaking amplifiers 236 and 246). In another embodiment, a shunt 90 degree short-circuited stub may be used to "under-compensate" for the differential group delay between the main and peaking path output circuits (including main and peaking amplifiers 236 and 246). To re-configure the amplifier 200 to achieve under-compensation for the differential group delay, for example, the shunt 90 degree short-circuited stub 233 may be moved from the location shown in FIG. 2A to a corresponding location along the peaking path 240 (e.g., the 90 degree short-circuited stub 233 may be removed from the main path 230, and instead may be coupled to the peaking path 240 between output 217 and the input to the input matching network 244), while the delay element 232 remains in the main path 230. Either way, inclusion of the 90 degree short-circuited stub 233 may beneficially alter the load impedance dispersion characteristics at peak power conditions.

Referring again briefly to FIG. 4, plot 463 illustrates a differential phase characteristic at the inputs to the main and peaking input matching networks 234, 244 for an embodiment of a Doherty amplifier 200 that includes phase-tracking power divider (including divider 210 and 90 degree phase delay element 232), and shunt 90 degree short-circuited stub 233. More specifically, plot 463 indicates the frequency-dependent phase differential between the main and peaking signals over a simulated frequency range of 1800 MHz to 2200 MHz, with 2000 MHz corresponding to the center frequency of operation, fo. In plot 463, the frequency-dependent phase differential from plot 462 for a conventional Doherty amplifier with a Wilkinson-type power divider and a 90 degree phase delay element (e.g., amplifier 100 with divider 110 and phase delay element 132, FIG. 1) is reproduced as trace 465. Over the simulated frequency range, the slope of the frequency-dependent phase differential for the uncompensated amplifier (trace 465) is about −20 degrees/400 MHz, or about −0.05 degrees/MHz, although a typical frequency-dependent phase differential may be larger or smaller.

According to an embodiment, inclusion of the 90 degree short-circuited stub 233 functions to over-compensate for the differential group delay between the main and peaking path output circuits (including main and peaking amplifiers 236 and 246) by altering (increasing) the magnitude of the slope of the frequency-dependent insertion phase (comparing trace 442 in plot 442 with trace 443 in plot 433) of the main amplifier path, and thus increasing the slope of the frequency-dependent phase differential between the input portions of the main and peaking paths, as indicated by trace 464. Accordingly, at frequencies that are lower or higher than the center frequency, fo, the phase differential between the main and peaking input circuits of Doherty amplifier 200 is significantly different from the phase differential that characterizes input circuit of Doherty amplifier 100. For example, in the over-compensation embodiment, at 1800 MHz (left edge of plot 463), the phase differential between the main and peaking input circuits of conventional Doherty amplifier 100 is about 80 degrees, whereas the phase differential between the main and peaking input circuits of Doherty amplifier 200 is about 72 degrees. Over the simulated frequency range, the slope of the frequency-dependent phase differential of the over-compensated amplifier (trace 464) is about −38 degrees/400 MHz, or about −0.10 degrees/MHz. As compared with the slope of the uncompensated amplifier (trace 465), this represents about a 50 percent increase in the magnitude of the slope of the frequency-dependent phase differential across an operational band from 1800 to 2200 MHz. According to an embodiment, an alteration of the magnitude of the slope of the frequency-dependent phase differential of the input circuit that is considered to "over-compensate" for the differential group delay of the main and peaking path output circuits is an increase in the insertion phase and/or differential phase slope magnitude that is greater than about 5 percent, in one embodiment, or greater than about 10 percent, or greater than about 25 percent, in yet another embodiment, or greater than about 50 percent, in yet another embodiment. The degree of over-compensation may be controlled by adjusting the characteristic impedance, Zs, of the stub 233 (e.g., higher Zs for less over-compensation, and lower Zs for greater over-compensation).

According to an alternate embodiment, and as mentioned above, inclusion of a 90 degree short-circuited stub (e.g., stub 233) along the peaking path 240 (as opposed to the main path 230) may function to under-compensate for the differential group delay of the main and peaking path output circuits (including main and peaking amplifiers 236 and 246). This would be achieved by altering (increasing) the magnitude of the slope of the frequency-dependent insertion phase of the peaking amplifier path (i.e., increasing the slope of trace 453 in plot 433 as compared with the slope of trace 452 in plot 432), thus decreasing the slope of the frequency-dependent phase differential between the input portions of the main and peaking paths (trace 466), as compared with the slope of the uncompensated amplifier (trace 465). Accordingly, at frequencies that are lower or higher than the center frequency, fo, the phase differential between the main and peaking input circuits of Doherty amplifier 200 is significantly different from the phase differential between the main and peaking input circuits of Doherty amplifier 100. For example, in the under-compensation embodiment, at 1800 MHz (left edge of plot 463), the phase differential between the main and peaking input circuits of Doherty amplifier 100 is about 80 degrees, whereas the phase differential between the main and peaking input circuits of Doherty amplifier 200 is about 85 degrees. Over the simulated frequency range, the slope of the frequency-dependent phase differential of the under-compensated amplifier (trace 466) is about −10 degrees/400 MHz, or about −0.025 degrees/MHz. As compared with the slope of the uncompensated amplifier (trace 465), this represents about a 50 percent decrease in the magnitude of the slope of the frequency-dependent phase differential. According to an embodiment, an alteration of the magnitude of the slope of the frequency-dependent phase differential of the input circuit that is considered to "under-compensate" for the differential group delay of the main and peaking path output circuits is a decrease in the insertion phase and/or differential phase slope magnitude that is greater than about 5 percent, in one embodiment, or greater than about 10 percent, in another embodiment, or greater than about 25 percent, in yet another embodiment, or greater than about 50 percent, in yet another embodiment. The degree of under-compensation may be controlled by adjusting the characteristic impedance, Zs, of the stub 233 (e.g., higher Zs for less under-compensation, and lower Zs for greater under-compensation).

The 90 degree short-circuited stub 233 may include a transmission line with a 90 degree electrical length, with one end of the transmission line connected to the main amplifier path 230 for the over-compensation embodiment (or to the peaking amplifier path 240 for the under-compensation embodiment), and with the other end connected to a ground reference node. The characteristic impedance, Zs, of the stub 233 is a function of its width. According to various embodiments, and as mentioned above, the magnitude or degree of the compensation provided by the 90 degree short-circuited stub 233 may be adjusted by adjusting the characteristic impedance (e.g., by adjusting the width), Zs, of the stub 233. With the electrical length of the stub 233 being held the same (e.g., 90 degrees), the characteristic impedance, Zs, may be increased, for example, by reducing the width of the stub 233. Conversely, the characteristic impedance, Zs, may be decreased, for example, by increasing the width of the stub 233. For example, the characteristic impedance, Zs, may be in a range of about 5 Ohms to about 200 Ohms, although the characteristic impedance may be smaller or larger, as well (e.g., less than 5 Ohms, or between 200 Ohms and 500 Ohms or greater). As will be explained in more detail later, the characteristic impedance, Zs, of the stub 233 may be optimized to achieve the best system performance. For example, to provide a greater degree of compensation, the characteristic impedance of the stub 233 may be reduced, whereas to provide a lower degree of compensation, the characteristic impedance of the stub 233 may be increased.

In some embodiments of a physical implementation of Doherty amplifier 200, the power divider 210, the series delay element 232, and the stub 233 may be implemented on the printed circuit board (PCB) level as distinct components. For example, the power divider 210 may be a distinctly packaged or surface mount device (SMD), and the series delay element 232 and the stub 233 may be transmission line elements formed from portions of one or more conductive layers on or within the PCB. In another embodiment, the series delay element 232 and the stub 233 may be packaged together into a distinctly packaged device or SMD (e.g., as indicated by dashed box 280). In still another embodiment, the power divider 210, the series delay element 232, and the stub 233 all may be packaged together into a distinctly packaged device or SMD (e.g., as indicated by dashed box 290), where outputs 215, 217 represent the outputs of the divider/compensation circuit SMD 290. In still another embodiment, substantially all of the components of the Doherty amplifier 200 (with the exception of load 206) may be incorporated together in a module.

Figure 2B:
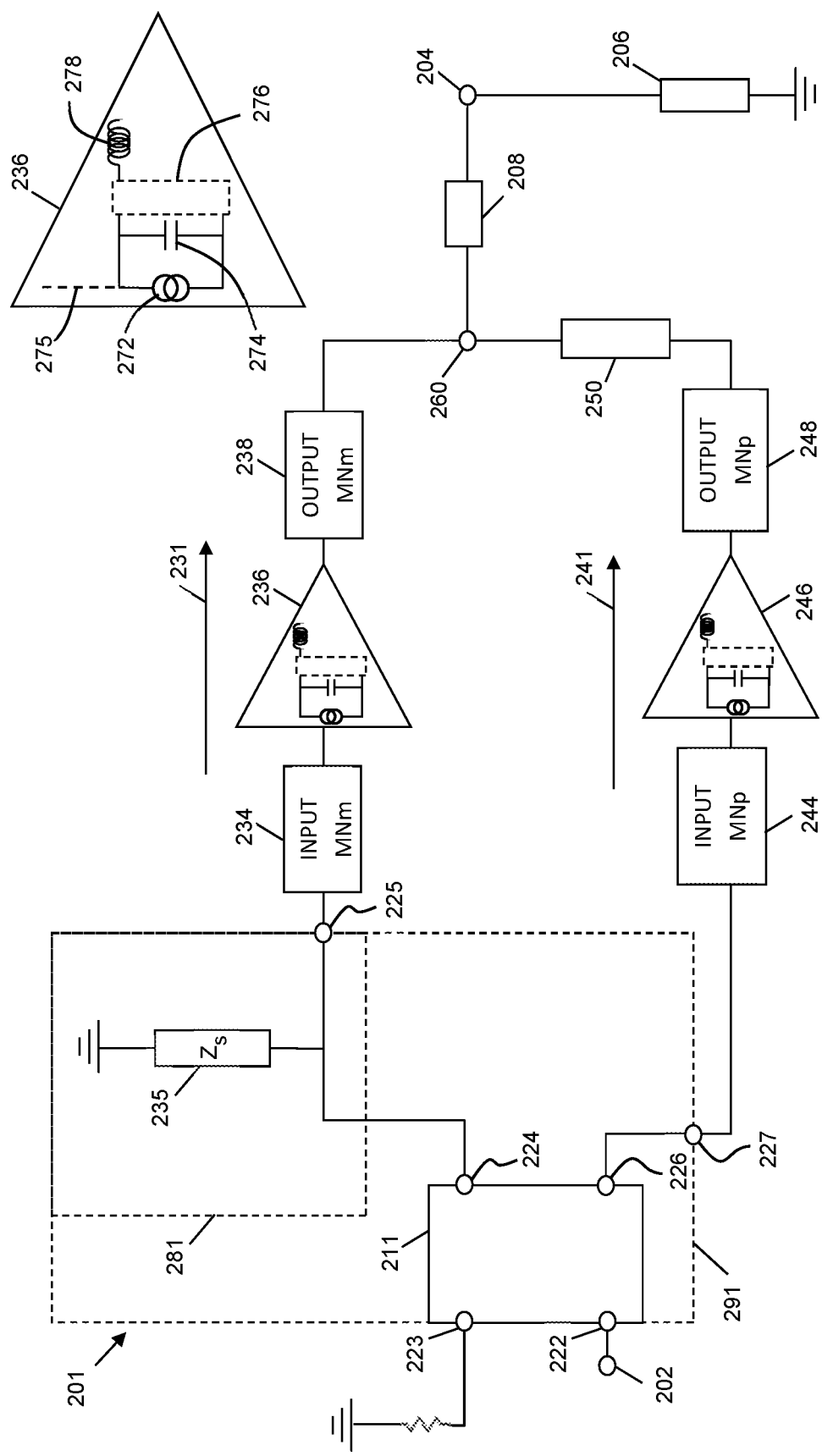
FIG. 2B is a simplified schematic diagram of a Doherty amplifier, in accordance with another embodiment.

FIG. 2B is a simplified schematic diagram of a Doherty amplifier 201, in accordance with another embodiment. Doherty amplifier 201 has a number of similarities to Doherty amplifier 200, FIG. 2A, and where corresponding elements may be substantially similar or identical between the two Figures, identical reference numbers are used. The various details described above in conjunction with the identically-numbered elements, along with the various alternate embodiments discussed, apply equally to the elements of FIG. 2B. For the purpose of brevity, some of those details and alternate embodiments are not repeated here.

The Doherty amplifier 201 of FIG. 2B also has an inverted topology. In addition, as will be described in more detail below, Doherty amplifier 201 includes a compensation circuit 281, including a shunt 90 degree short-circuited stub 235, in the input circuit to the main amplifier 236. As with compensation circuit 280 (FIG. 2A), compensation circuit 281 functions to over-compensate for the difference between the main and peaking amplifier path group delays, in an embodiment. In an alternate embodiment, the compensation circuit 281 may function to under-compensate for the difference between the main and peaking amplifier path group delays.

Amplifier 201 generally includes an input circuit (i.e., components between an input node 202 and the amplifier inputs), an output circuit (i.e., components between the amplifier outputs and combining node 260), and multiple parallel-coupled amplifiers 236, 246 between the input and output circuits. More specifically, amplifier 201 includes an input node 202, an output node 204, a power divider 211, a main amplifier path 231, a peaking amplifier path 241, and a combining node 260. A load 206 may be coupled to the combining node 260 through an impedance transformer 208, in an embodiment. The impedance transformer 208 may impart a 90 degree phase delay to the output RF signal before it is supplied to the load 206. Alternatively, the impedance transformer 208 may be excluded.

The power divider 211 divides an input RF signal supplied at the input node 202, and the divided signals are separately amplified along the main and peaking amplifier paths 231, 241. The amplified signals are then combined at the combining node 260. As will be explained in more detail below, inclusion of the shunt 90 degree short-circuited stub 235 alters the relative main and peaking RF signal phases to favorably alter the load impedance dispersion characteristics (e.g., to favorably alter the wideband load-modulation characteristic). Phase coherency between the main and peaking amplifier paths 231, 241 may or may not be maintained across the entire band of operation.

Power divider 211 differs from power divider 210 (FIG. 2A), in that power divider 211 (FIG. 2B) produces main and peaking RF signals at outputs 224 and 226 that have about a 90 degree phase difference independent of frequency. In other words, power divider 211 produces the main and peaking RF signals at outputs 224, 226 with a constant quadrature (90 degree) phase shift difference versus frequency. In contrast, power divider 210 (FIG. 2A) produces equal-phase main and peaking RF signals at outputs 214, 216 (FIG. 2A), respectively. In other words, power divider 210 outputs the main and peaking RF signals at outputs 214, 216 with about zero degrees of phase difference between the signals, as discussed previously, whereas power divider 211 outputs the main and peaking RF signals at outputs 224, 226 with about a 90 degree phase difference.

Each of the main amplifier 236 and the peaking amplifier 246 includes one or more single stage or multiple-stage power transistor ICs for amplifying an RF signal conducted through the amplifier 236, 246. The main and peaking power transistor ICs may be of equal size (e.g., in a symmetric Doherty configuration), or of unequal size (e.g., in various asymmetric Doherty configurations). During operation of Doherty amplifier 201, main amplifier stage 236 is biased to operate in class AB mode, and peaking amplifier stage 246 is biased to operate in class C mode.

Input and output impedance matching networks 234, 238 (input MNm, output MNm) may be implemented at the input and/or output of the main amplifier 236. Similarly, input and output impedance matching networks 244, 248 (input MNp, output MNp) may be implemented at the input and/or output of the peaking amplifier 246.

As with amplifiers 100, 200, Doherty amplifier 201 has an inverted load network configuration. In the inverted configuration, the input circuit is configured so that an input signal supplied to the main amplifier 236 is delayed by about 90 degrees with respect to the input signal supplied to the peaking amplifier 246 at the center frequency of operation, fo, of the amplifier 201.

Power divider 211 is a hybrid power splitter (e.g., an Anaren-type power divider), in an embodiment, which includes input 222 coupled to the input signal node 202, a terminated port 223 (e.g., terminated with a 50 ohm termination to ground), and splitter outputs 224, 226. According to an embodiment, when terminated as illustrated in FIG. 2B, power divider 211 receives an input RF signal through input 222, divides the signal, and outputs main and peaking portions of the input signal at splitter outputs 224, 226 with a constant quadrature (i.e., about 90 degree) phase shift difference versus frequency. In other words, the power divider 211 is configured to provide quadrature-phase main and peaking signals at outputs 224, 226, respectively. According to an embodiment, power divider 211 divides the RF signal received at input 222 so that, at fo, the main input signal produced at output 224 has about a 90 degree relative phase lag compared to the peaking input signal produced at output 226. In other words, power divider 211 imparts about a 90 degree delay to the RF signal produced at output 224, when compared with the RF signal produced at output 226. As mentioned above, power divider 211 may be a hybrid power splitter, although power divider 211 alternatively may be another suitable type of divider that has the above characteristic of outputting multiple signals with a 90 degree phase difference (or some other phase difference) (e.g., a branch-line coupler, broad-band multi-section branch-line, lumped element quadrature, mixed lumped distributed or any other suitable type of divider).

The main input signal is provided to the main amplifier path 231 at power divider output 224, and the peaking input signal is provided to the peaking amplifier path 241 at power divider output 226. During operation in a full-power mode when both the main and peaking amplifiers 236, 246 are supplying current to the load 206, the power divider 211 divides the input signal power between the amplifier paths 231, 241. For example, the power divider 211 may divide the power equally, such that roughly one half of the input signal power is provided to each path 231, 241 (e.g., for a symmetric Doherty amplifier configuration). Alternatively, the power divider 211 may divide the power unequally (e.g., for an asymmetric Doherty amplifier configuration).

To establish a correct load modulation characteristic, the main output path including output matching network (output MNm) 238 plus any output pre-match within main amplifier device 236 (e.g., output pre-match 276 and inductance 278) plus any output parasitic element (e.g. drain-source capacitance 274) is configured to impart a total phase delay of about 90 degrees, and the peaking output path including a delay element 250 plus output matching network (output MNp) 248 plus any output pre-match within peaking amplifier device 246 (e.g., output pre-match 276 and inductance 278) plus any output parasitic element (e.g. drain-source capacitance 274) is configured to impart a total phase delay of about 180 degrees.

To compensate for the resulting 90 degree phase delay difference between the main and peaking amplifier paths 231, 241 at the outputs of amplifiers 236, 246 (i.e., to ensure that the amplified signals arrive substantially in phase at the combining node 260), and as discussed above, the power divider 211 is configured to apply about a 90 degree phase delay to the signal that is provided to the input of main amplifier 236, with respect to the signal that is provided to the input of peaking amplifier 246. However, to ensure that the amplified signals arrive substantially in phase at the combining node 260 over a desired bandwidth, it is also important to account for the fact that the group delay of the peaking amplifier path 241 at the output of amplifier 246 is greater than the group delay of the main amplifier path 231 at the output of amplifier 236.

As will be described in more detail below, the output circuit of the peaking amplifier path 241 is about 90 degrees longer than the output circuit of the main amplifier path 231. Thus, the input circuit of the main amplifier path 231 should have a corresponding 90 degree phase delay (e.g., as provided by power divider 211) to ensure that RF signals are received coherently at the output combining node 260. Power divider 211 essentially matches the main and peaking path insertion phase characteristics over frequency, and phase coherency between the main and peaking signals may be substantially maintained through the main and peaking amplifier paths 231, 241. In actuality, precise phase coherency between the main and peaking amplifier paths 231, 241 may or may not be maintained across the entire band of operation as a result of the inclusion of the 90 degree short-circuited stub 235. However, the resulting beneficial alteration of the load impedance dispersion characteristics at peak power conditions may result in improved performance, when compared with traditional Doherty amplifier architectures.

According to an embodiment, a shunt 90 degree short-circuited stub 235 is included along the main input path, which functions to alter the frequency-dependent phase characteristic of the power divider 211, or to alter the slope of the frequency-dependent phase characteristic of the input circuit to the main amplifier 236. In one embodiment, the shunt 90 degree short-circuited stub 235 functions to "over-compensate" for the differential group delay of the main and peaking path output circuits (including main and peaking amplifiers 236 and 246). In another embodiment, a shunt 90 degree short-circuited stub may be used to "under-compensate" for the differential group delay between the main and peaking path output circuits (including main and peaking amplifiers 236 and 246). To re-configure the amplifier 201 to achieve under-compensation for the differential group delay, for example, the shunt 90 degree short-circuited stub 235 may be moved from the location shown in FIG. 2B to a corresponding location along the peaking path 241 (e.g., the 90 degree short-circuited stub 235 may be removed from the main path 231, and instead may be coupled to the peaking path 241 between output 227 and the input to the input matching network 244). Either way, inclusion of the 90 degree short-circuited stub 235 may beneficially alter the load impedance dispersion characteristics at peak power conditions.

As discussed previously in conjunction with FIG. 1, the flat differential phase characteristic of a hybrid power splitter across a wide frequency range may render a hybrid power splitter suitable for use only with relatively narrow-band conventional Doherty power amplifiers. However, by including short-circuited stub 235, in accordance with an embodiment, the relatively flat differential phase characteristic of power divider 211 (e.g., a hybrid power splitter) is compensated for by re-introducing a differential phase characteristic.

Referring again briefly to FIG. 4, in a manner that is similar to the effect of stub 233 (FIG. 2A), inclusion of the 90 degree short-circuited stub 235 functions to over-compensate for the differential group delay between the main and peaking path output circuits (including main and peaking amplifiers 236 and 246) by altering (increasing) the magnitude of the slope of the frequency-dependent insertion phase (comparing trace 442 in plot 432 with trace 443 in plot 433) of the main amplifier path, and thus increasing the slope of the frequency-dependent phase differential between the input portions of the main and peaking paths, as indicated by trace 464. The degree of over-compensation may be controlled by adjusting the characteristic impedance, Zs, of the stub 235 (e.g., higher Zs for less over-compensation, and lower Zs for greater over-compensation).

According to an alternate embodiment, and as mentioned above, inclusion of a 90 degree short-circuited stub (e.g., stub 235) along the peaking path 241 (as opposed to the main path 231) may function to under-compensate for the differential group delay of the main and peaking path output circuits (including main and peaking amplifiers 236 and 246). According to an embodiment, an alteration of the magnitude of the slope of the frequency-dependent phase differential of the input circuit that is considered to "under-compensate" for the differential group delay of the main and peaking path output circuits is a decrease in the insertion phase and/or differential phase slope magnitude that is greater than about 5 percent, in one embodiment, or greater than about 10 percent, in another embodiment, or greater than about 25 percent, in yet another embodiment, or greater than about 50 percent, in yet another embodiment. The degree of under-compensation may be controlled by adjusting the characteristic impedance, Zs, of the stub 235 (e.g., higher Zs for less under-compensation, and lower Zs for greater under-compensation).

In some cases, the range of over-compensation (or under-compensation) for the combination of quadrature power divider 211 and stub 235 (FIG. 2B) may be less than the range of over-compensation (or under-compensation) for the combination of power divider 210, stub 233 and series delay element 232 (FIG. 2A) since a Wilkinson-type of power divider combined with series delay element 232 already has a differential phase characteristic. In other words, the slope of traces 465 and 466 may be less for the embodiment of FIG. 2B than for the embodiment of FIG. 2A.

The 90 degree short-circuited stub 235 may include a transmission line with a 90 degree electrical length, with one end of the transmission line connected to the main amplifier path 231 for the over-compensation embodiment (or to the peaking amplifier path 241 for the under-compensation embodiment), and with the other end connected to a ground reference node. Again, the characteristic impedance, Zs, of the stub 235 is a function of its width. According to various embodiments, and as mentioned above, the magnitude or degree of the compensation provided by the 90 degree short-circuited stub 235 may be adjusted by adjusting the characteristic impedance (e.g., by adjusting the width), Zs, of the stub 235. With the electrical length of the stub 235 being held the same (e.g., 90 degrees), the characteristic impedance, Zs, may be increased, for example, by reducing the width of the stub 235. Conversely, the characteristic impedance, Zs, may be decreased, for example, by increasing the width of the stub 235. For example, the characteristic impedance, Zs, may be in a range of about 5 Ohms to about 200 Ohms, although the characteristic impedance may be smaller or larger, as well (e.g., less than 5 Ohms, or between 200 Ohms and 500 Ohms or greater). The characteristic impedance, Zs, of the stub 235 may be optimized to achieve the best system performance. For example, to provide a greater degree of compensation, the characteristic impedance of the stub 235 may be reduced, whereas to provide a lower degree of compensation, the characteristic impedance of the stub 235 may be increased.

In some embodiments of a physical implementation of Doherty amplifier 201, the power divider 211 and the stub 235 may be implemented on the PCB level as distinct components. For example, the power divider 211 may be a distinctly packaged device or an SMD, and the stub 235 may be a transmission line element formed from portions of one or more conductive layers on or within the PCB. In another embodiment, the stub 235 may be packaged into a distinctly packaged device or SMD (e.g., as indicated by dashed box 281). In still another embodiment, the power divider 211 and the stub 235 may be packaged together into a distinctly packaged device or SMD (e.g., as indicated by dashed box 291), where outputs 225, 227 represent the outputs of the divider/compensation circuit SMD 291. In still another embodiment, substantially all of the components of the Doherty amplifier 201 (with the exception of load 206) may be incorporated together in a module.

The Doherty amplifiers 200, 201 of FIGS. 2A, 2B include a single compensation circuit 280, 281 in the input circuit of the main amplifier path 230, 231, where the compensation circuit 280, 281 includes a single 90 degree short-circuited stub 233, 235. Various alternate embodiments of Doherty amplifiers may include multiple compensation circuits in the input circuits of the main and/or peaking amplifier paths, including multiple series delay elements and/or multiple 90 degree short-circuited stubs.

Figure 3A:
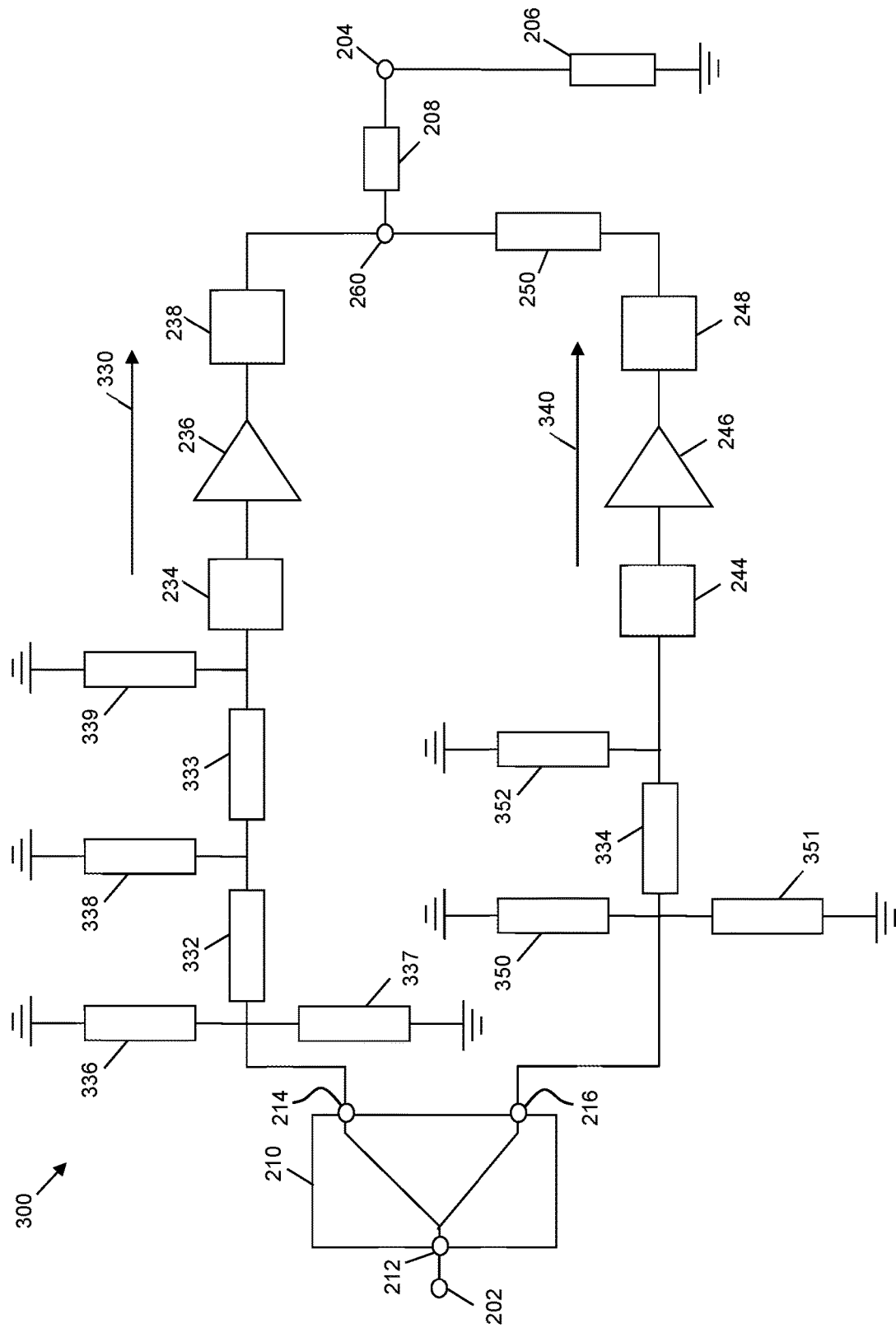
FIG. 3A is a simplified schematic diagram of a Doherty amplifier, in accordance with yet another embodiment.
Figure 3B:
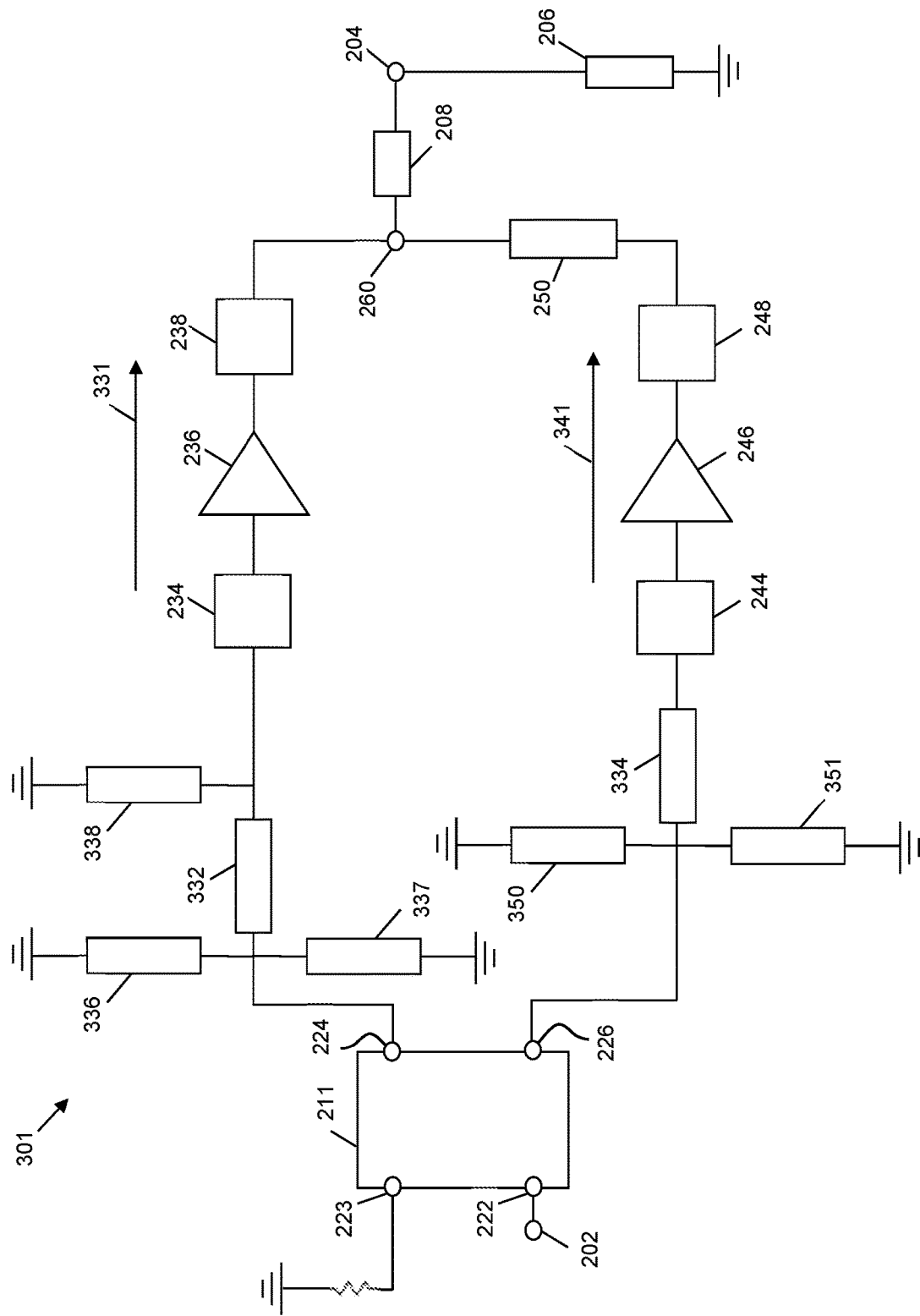
FIG. 3B is a simplified schematic diagram of a Doherty amplifier, in accordance with yet another embodiment.

To provide a basis for understanding how the Doherty amplifiers 200, 201 of FIGS. 2A and 2B may be modified in a variety of ways, FIGS. 3A and 3B are simplified schematic diagrams of Doherty amplifiers 300, 301, in accordance with two example embodiments. In FIG. 3A, Doherty amplifier 300 includes a plurality of series delay elements 332, 333, 334, and a plurality of 90 degree short-circuited stubs 336, 337, 338, 339, 350, 351, 352 along the input circuits of a main amplifier path 330 and a peaking amplifier path 340. In FIG. 3B, Doherty amplifier 301 includes a plurality of series delay elements 332, 334, and a plurality of 90 degree short-circuited stubs 336, 337, 338, 350, 351 along the input circuits of a main amplifier path 331 and a peaking amplifier path 341. Doherty amplifiers 300, 301 have a number of similarities to Doherty amplifiers 200, 201 of FIGS. 2A, 2B, and where elements may be substantially similar or identical between the two Figures, identical reference numbers are used. The various details described above in conjunction with the identically-numbered elements, along with the various alternate embodiments discussed, apply equally to the elements of FIGS. 3A and 3B. For the purpose of brevity, some of those details and alternate embodiments are not repeated here.

Each of the series delay elements 332, 333, 334 may be implemented as a 90 degree transmission line element, in an embodiment, so that the main and peaking signals provided at the inputs to amplifiers 236, 246 are about 90 degrees out of phase. In each alternate embodiment of the Doherty amplifier 300 (FIG. 3A), and assuming each delay element is a 90 degree delay element, the number of series delay elements (e.g., elements 332, 333) in the main path 330 should exceed number of delay elements (e.g., element 334) in the peaking path 340 by one to maintain a 90 degree phase delay at fo in the main path 330, as is required for inverted Doherty operation. In an alternate embodiment in which a non-inverted Doherty amplifier is implemented, an opposite relationship between the number of delay elements would apply (e.g., the number of 90 degree delay elements in the peaking path would exceed the number of delay elements in the main path by one to maintain a 90 degree phase delay at fo in the peaking path). Conversely, in each alternate embodiment of the Doherty amplifier 301 (FIG. 3B), and assuming each delay element is a 90 degree delay element, the number of series delay elements (e.g., elements 332) in the main path 331 should equal the number of delay elements (e.g., element 334) in the peaking path 341 to maintain a 90 degree phase delay at fo in the main path 331, as is required for inverted Doherty operation. In an alternate embodiment in which a non-inverted Doherty amplifier is implemented, the same relationship between the number of delay elements would apply (e.g., the number of 90 degree delay elements in the peaking path would equal the number of delay elements in the main path to maintain a 90 degree phase delay at fo in the peaking path). In this case the polarity of the input hybrid splitter 211 would be reversed to maintain the correct 90 degree phase delay at fo.

A difference between Doherty amplifiers 200, 201 (FIGS. 2A, 2B) and Doherty amplifiers 300, 301 is that Doherty amplifiers 300, 301 each include a plurality of 90 degree short-circuited stubs 336-339, 350-352 that are connected to the input circuits of the main or peaking paths or both 330, 331, 340, 341 at a variety of locations. For example, stubs 336, 337 (or stubs 350, 351) are shown to illustrate that one or more stubs may be connected to a same node along an input circuit (i.e., a node that is before delay element 332 or delay element 334). Stub 338 is shown to illustrate that one or more stubs may be connected after a delay element 332 or between delay elements 332, 333. Stubs 339 and 352 are shown to illustrate that one or more stubs may be connected to a node along an input circuit that is between a delay element 333 or 334 and an input to an input matching network 234 or 244 (input MNm). Stubs 336-339, 350-352 are shown to illustrate that one or more stubs may be connected to nodes of an input circuit of a peaking amplifier path 340, 341 that are before and/or after a delay element 334. By including multiple 90 degree series delay elements and/or multiple 90 degree short circuited stubs, a wide range of differential phase characteristics may be obtained.

In the case of multiple compensation circuits, the degree of over- or under-compensation would be determined by which input path contained greatest number of shunt stub elements or alternatively the path that has the greatest compensation effect as a result of the characteristic impedances chosen for the various stubs. For example, in some embodiments, over-compensation may be achieved when the number of shunt stubs in the main input path 330, 331 of amplifier 300, 301 is greater than the number of shunt stubs in the peaking input path 340, 341 of amplifier 300, 301, and/or the characteristic impedances of the shunt stubs in the main input path 330, 331 are chosen in such a manner to outweigh the influence of the stubs in the peaking input path 340, 341. In other embodiments, under-compensation may be achieved when the number of shunt stubs in the main input path 330, 331 of amplifier 300, 301 is less than the number of shunt stubs in the peaking input path 340, 341 of amplifier 300, 301, and/or the characteristic impedances of the shunt stubs in the main input path 330, 331 are chosen in such a manner to have lower influence than the stubs in the peaking input path 340, 341. Again, relatively high characteristic impedances of the stubs may result in less compensation, whereas relatively low characteristic impedances of the stubs may result in greater compensation. In any case, in Doherty amplifier 300 (FIG. 3A), the number of series delay elements (e.g., elements 332, 333) in the main path 330 must exceed the number of delay elements (e.g., element 334) in the peaking path 340 by one to maintain the 90 degree phase delay at fo in the main path 330, as required for inverted Doherty operation. Opposite relationships apply for non-inverted Doherty operation, because the main output path is 90 degrees longer than the peaking output path for non-inverted Doherty operation. Conversely, in Doherty amplifier 301 (FIG. 3B), the number of series delay elements (e.g., element 332) in the main path 331 must equal the number of delay elements (e.g., element 334) in the peaking path 341 to maintain the 90 degree phase delay at fo in the main path 331, as required for inverted or non-inverted Doherty operation.

Although FIGS. 2A, 2B, 3A, and 3B illustrate embodiments of inverted Doherty amplifier topologies, other embodiments include non-inverted Doherty amplifier topologies. For example, a non-inverted alternate embodiment of either amplifier 200, 201 may include a phase and delay compensation circuit (e.g., phase and delay compensation circuit 280, 281) in the input path to the peaking amplifier, and a distinct impedance inverter and delay element in the output path of the main amplifier. Similarly, such a non-inverted alternate embodiment of either amplifier 300, 301 may have multiple phase and delay compensation circuits in the main and/or peaking input paths.

In addition, although FIGS. 2A, 2B, 3A, and 3B illustrate embodiments of Doherty amplifiers that include one main amplifier path 230, 231, 330, 331 and one peaking amplifier path 240, 241, 340, 341, embodiments of phase and delay compensation circuits may be implemented in Doherty amplifiers that include more than one peaking amplifier path, as well. For example, an alternate Doherty amplifier embodiment may be a three-way Doherty amplifier with a three-way input splitter, one main amplifier path, and two peaking amplifier paths, where embodiments of one or more compensation circuits are implemented in the input circuits for one or more of the paths. Another alternate Doherty amplifier embodiment may be a four-way Doherty amplifier with a four-way input splitter, one main amplifier path, and three peaking amplifier paths, where embodiments of one or more compensation circuits are implemented in the input circuits for one or more of the paths.

FIGS. 4-9 are provided to illustrate the potential performance advantages that may be achieved by including one or more passive phase compensation circuits in an embodiment of a Doherty amplifier. The various plots and charts in FIGS. 4-9 compare results that may be achieved for various differently configured Doherty amplifiers. As used below:

"conventional amplifier A" refers to a conventional Doherty amplifier, such as Doherty amplifier 100, FIG. 1, which includes a power splitter that imparts a constant quadrature phase independent of frequency to the output signals of the power splitter, such as the hybrid power splitter 111, FIG. 1. In other words, the power splitter exhibits constant quadrature phase versus frequency characteristics, or $$\frac{v_{carrier}}{v_{peaking}} = -j;$$

"conventional amplifier B" refers to refers to a conventional Doherty amplifier, such as Doherty amplifier 100, FIG. 1, which includes a power splitter that provides phase tracking versus frequency to the output signals of the power splitter, such as the Wilkinson-type power divider 110 and a phase delay element 132 in the form of a 90 degree transmission line, FIG. 1, or $$\frac{v_{carrier}}{v_{peaking}} = \cos(\theta) - j \cdot \sin(\theta),$$

where $$\theta = \frac{2 \cdot \pi \cdot l}{\lambda},$$

l is physical length of phase delay element 132, and λ corresponds to one wavelength; and "compensated amplifier C1" and "compensated amplifier C2" (collectively referred to as "compensated amplifiers C1/C2," where "C1/C2" means both or either compensated amplifier C1 and/or C2) refer to embodiments of inverted Doherty amplifiers that include a single compensation circuit in the main amplifier path, such as Doherty amplifiers 200, 201, FIGS. 2A, 2B. Compensated amplifier C1 corresponds to Doherty amplifier 200, which includes a power splitter 210 that provides equal phase output signals (e.g., a Wilkinson-type or other type of power splitter), a delay element 232 in the form of a 90 degree transmission line, and a shunt 90 degree short-circuited stub element 233. Conversely, compensated amplifier C2 corresponds to Doherty amplifier 201, which includes a power splitter 211 that imparts a constant quadrature phase to the output signals of the power splitter 211 (e.g., a hybrid or other type of power splitter), and a shunt 90 degree short-circuited stub element 235. In compensated amplifiers C1/C2, the degree of phase/delay compensation may be controlled by adjusting the characteristic impedance, Zs, of the shunt 90 degree short-circuited stub element (e.g., stub 233, 235). In addition, the relationship of the main path RF current, Iin, immediately before the shunt stub element 233, 235 in the compensation circuit 280, 281 and the main path RF current, Iout, immediately after the shunt stub element 233, 235 in the compensation circuit 280, 281 is approximated by:

$$\frac{I_{in}}{I_{out}} = 1 - j \cdot \frac{Y_s}{Y_{out}} \cdot \cot(\theta),$$

$$\text{and with phase } \tan^{-1}\left[\frac{-Y_s}{Y_{out}} \cdot \cot(\theta)\right],$$

where $Y_s$ is the characteristic admittance (the reciprocal of the characteristic impedance $Z_s$) of the shunt stub element 233, 235 in the compensation circuit 280, 281, and $Y_{out}$ is the output admittance, or the admittance seen at the input of the 90 degree delay line element 232 (e.g., about 0.02 siemens (S) for a 50 ohm input impedance) in FIG. 2A, and admittance seen at the input of input matching element 234 in FIG. 2B.

In the plots and Smith charts of FIGS. 4, 5, and 7-9 that depict results over a range of frequencies (i.e., when the x-axis is frequency or the Smith chart includes points plotted over a frequency range), the "simulated frequency range" is from about 1800 megahertz (MHz) to about 2200 MHz, unless otherwise indicated. Although results are presented over a specific simulated frequency range, embodiments of Doherty amplifiers with compensation circuit(s) may be designed to support operational frequencies that are lower or higher than the simulated frequency range. Further, although the below results may have been obtained using a specifically configured embodiment of a Doherty amplifier (i.e., compensated amplifier C, described above), the example is not meant to be limiting, and similar or different results may be obtained using other embodiments as described elsewhere herein.

FIG. 4 includes plots illustrating input circuit group delay, insertion phase, and differential input phase characteristics (between the main and peaking paths) for two conventional Doherty amplifiers and for an embodiment of a Doherty amplifier that includes a passive phase compensation circuit in the main amplifier path (e.g., amplifier 200, 201, FIGS. 2A, 2B). More specifically, plots 401, 402, 403 illustrate main path input circuit group delay (traces 411, 412, 413) and peaking path input circuit group delay (traces 421, 422, 423), in nanoseconds, for conventional amplifier A, for conventional amplifier B, and for compensated amplifiers C1/C2, respectively. As discussed above, conventional amplifier A exhibits constant quadrature phase versus frequency characteristics due to the inclusion of the hybrid power splitter, conventional amplifier B exhibits phase tracking versus frequency due to the inclusion of the Wilkinson-type power splitter and a 90 degree series delay element, and a compensated amplifier C1/C2, exhibits phase tracking with compensation due to the inclusion of a phase-tracking input divider (e.g., a Wilkinson-type power splitter and a 90 degree series delay element or a hybrid power splitter) and a 90 degree short-circuited stub.

Plots 431, 432, 433 illustrate main path input circuit insertion phase (traces 441, 442, 443) and peaking path input circuit insertion phase (traces 451, 452, 453), in degrees, over the simulated frequency range for conventional amplifier A, conventional amplifier B, and compensated amplifier C1/C2, respectively. Finally, plots 461, 462, 463 illustrate differential phase, in degrees, between the main and peaking input paths at the inputs to the input matching networks over the simulated frequency range for conventional amplifier A, conventional amplifier B, and compensated amplifier C1/C2, respectively.

Plots 403, 433, 463 indicate that the inclusion of an embodiment of a compensation circuit (e.g., compensation circuit 280, 281, FIGS. 2A, 2B) in a Doherty amplifier may provide an over-compensated differential phase characteristic (trace 464) by modifying the slope of the main path input insertion phase (e.g., comparing the slopes of traces 442 and 443) or to provide an under-compensated differential phase characteristic (trace 466) by modifying the slope of the peaking path input insertion phase (e.g., comparing the slopes of traces 452 and 453). Either approach results in a modification of the differential insertion phase between the main and peaking input paths (e.g., comparing the trace in plot 462 with traces 464 and 466). The compensation strategy may result in a beneficial modification to the main and peaking load impedance dispersion characteristics.

Figure 5:
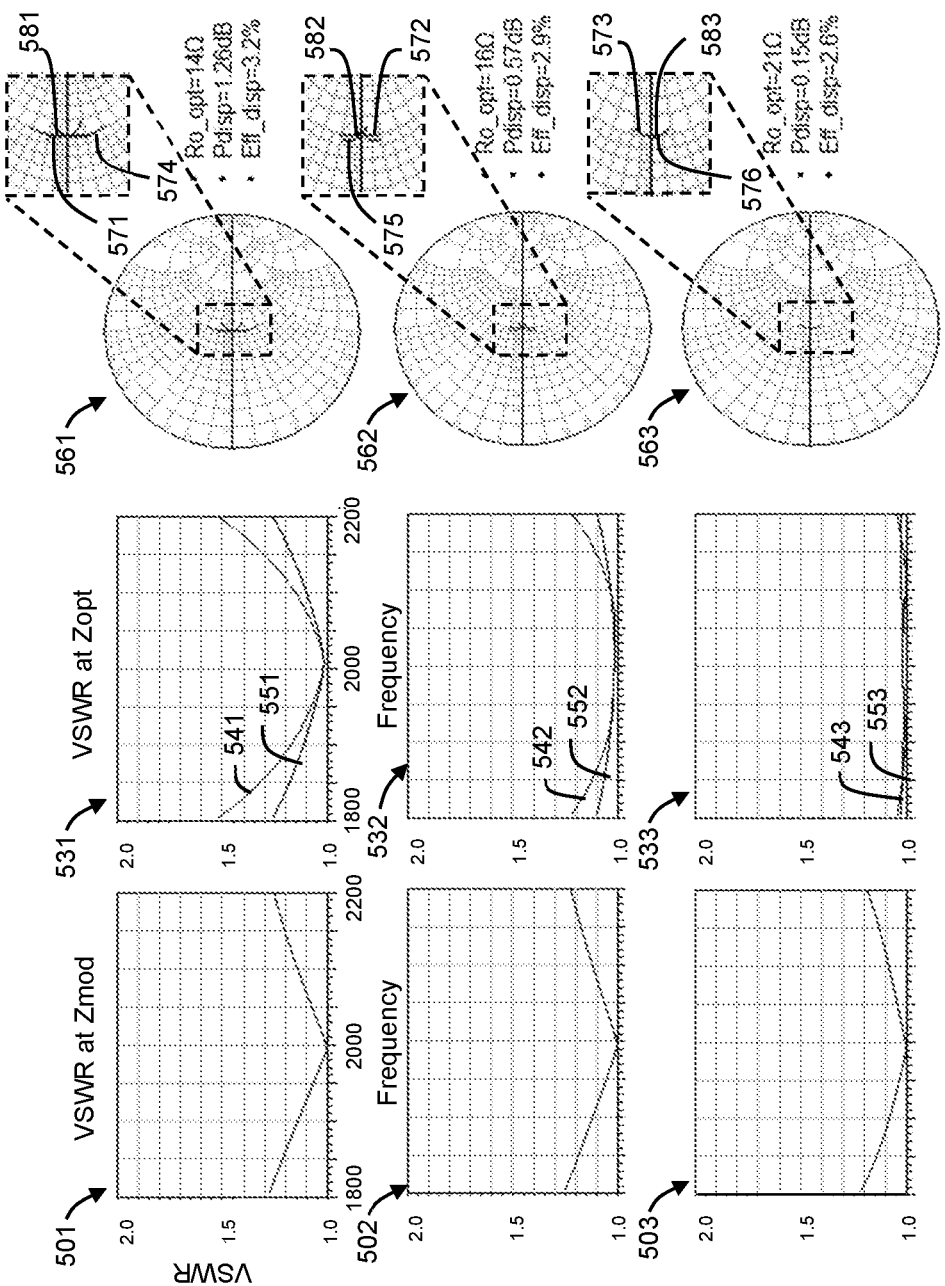
FIG. 5 includes plots and Smith charts illustrating main and peaking load characteristic at the intrinsic current generator reference plane for conventional Doherty amplifiers and an embodiment of a Doherty amplifier that includes a passive phase compensation circuit.

FIG. 5 includes plots and Smith charts illustrating main and peaking load characteristic at the intrinsic current generator reference plane (e.g., reference plane 275, FIGS. 2A, 2B) for two conventional asymmetric Doherty amplifiers (e.g., asymmetric versions of conventional amplifiers A and B) and an "optimized" embodiment of an asymmetric version of compensated amplifier C1/C2. In the "optimized" embodiment of compensated amplifier C1/C2 represented by these results, the system impedance, Ro, of the output circuit and the characteristic impedance, Zs, of the 90 degree short-circuited stub have been optimized. By determining and implementing an optimum combination of these two parameters, the full potential of the inventive subject matter may be realized. The load characteristics used are the voltage standing wave ratio (VSWR) seen at the output of the main device (intrinsic current generator reference plane) at Zmod (i.e., a low power, output power back-off condition) and the main and peaking devices (intrinsic current generator reference plane) at Zopt (i.e., a full power condition).

More specifically, plots 501, 502, 503 illustrate the VSWR at Zmod over the simulated frequency range for conventional amplifier A, conventional amplifier B, and an optimized compensated amplifier C1/C2, respectively. In addition, plots 531, 532, 533 illustrate main VSWR (traces 541, 542, 543) and peaking VSWR (traces 551, 552, 553) over the simulated frequency range for conventional amplifier A, conventional amplifier B, and an optimized compensated amplifier C1/C2, respectively. Finally, the corresponding load impedance dispersion characteristics over the simulated frequency range are shown in Smith charts 561, 562, 563, where the main reflection coefficient at Zmod is indicated with traces 571, 572, 573, the main reflection coefficient at Zopt is indicated with traces 574, 575, 576, and the peaking reflection coefficient at Zopt is indicated with traces 581, 582, 583. Shown on the far right in FIG. 5 are values representing the optimum system impedance, Ro opt, the calculated peak power dispersion, Pdisp, and the efficiency dispersion, Eff_Disp.

Ro (system impedance) is an independent design variable that governs the impedance transformation ratios of the output matching and transformer elements in the overall Doherty output circuit. As can be seen from FIG. 5, the optimum system impedance for the output circuit, Ro opt, is dependent on the input circuit configuration. It can be seen that inclusion of an embodiment of a phase compensation circuit in a Doherty amplifier may result in a higher optimum value of Ro (e.g., 21 ohms) compared with relatively low optimum values for conventional amplifiers A and B (e.g., 14 ohms and 16 ohms, respectively). This indicates potential benefits for the practical design and implementation of a Doherty amplifier that includes an embodiment of a compensation circuit, as a system impedance lower than about 20 ohms may be relatively challenging to implement using conventional low-cost RF dielectric materials due to the resulting increase in the dimensions of transmission line elements that should be implemented in the output circuit.

Furthermore, it can be seen that a Doherty amplifier with a compensation circuit embodiment may exhibit a dramatic reduction of the load impedance dispersion seen by the main and peaking devices at Zopt (e.g., at a full power condition, as indicated in plots 531-533). There also may be improvement in load impedance dispersion of the main device at Zmod (e.g., at an output power back-off condition, as indicated in plots 501-503) because a potentially higher optimum system impedance (e.g., Ro opt of about 21 ohms) would be in a more favorable region for lower load impedance dispersion at Zmod, when compared with conventional amplifiers A and B.

Further still, inclusion of a compensation circuit embodiment in a Doherty amplifier may allow the calculated peak power dispersion and efficiency dispersion to be reduced significantly. For example, in comparing the dispersion characteristics of conventional amplifier A with the dispersion characteristics of a Doherty amplifier with a compensation circuit embodiment, the peak power dispersion is reduced from 1.26 decibels (dB) to 0.15 dB, and the efficiency dispersion is reduced from 3.2 percent to 2.6 percent. The resulting reduction in peak power dispersion that may be exhibited using a compensation circuit embodiment may directly increase the utilization of such a wideband Doherty power amplifier, thereby potentially resulting in further improvements in efficiency at a fixed output power back-off level.

Figure 6:
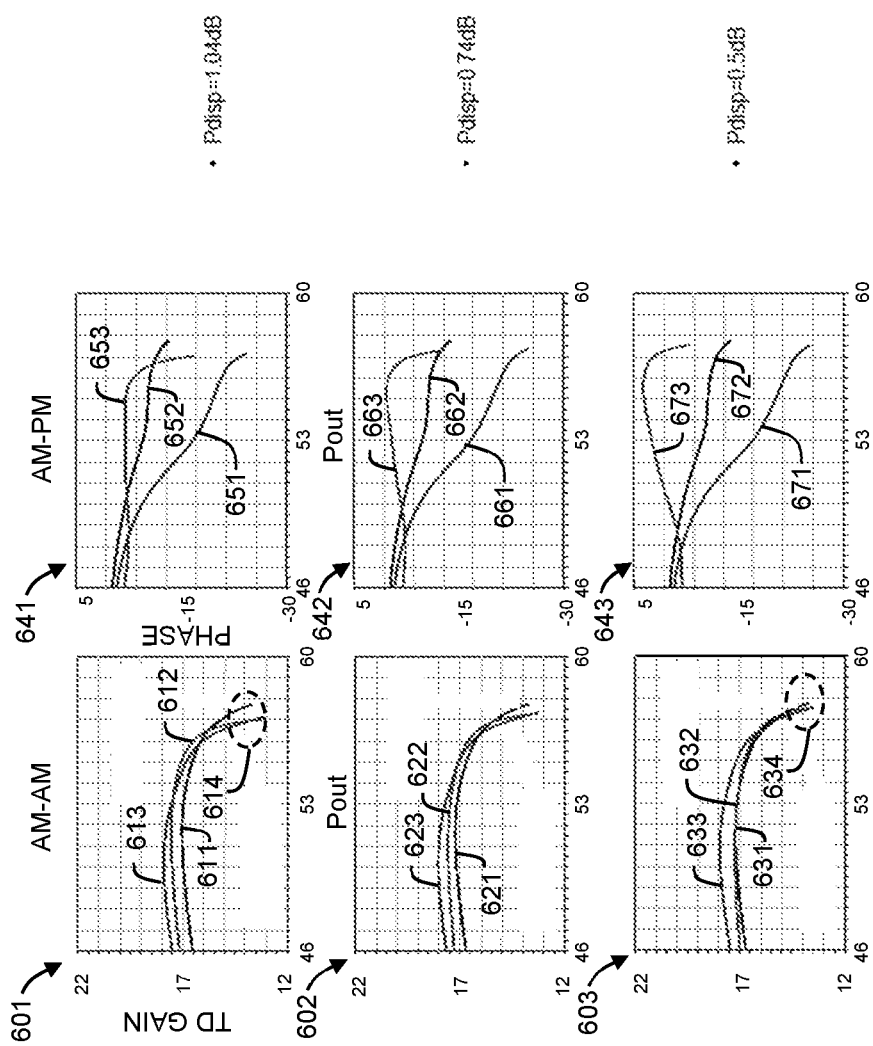
FIG. 6 includes plots illustrating AM-AM and AM-PM characteristics for conventional Doherty amplifiers and an embodiment of a Doherty amplifier that includes a passive phase compensation circuit.

FIG. 6 includes plots illustrating AM-AM and AM-PM characteristics for two conventional symmetric Doherty amplifiers (e.g., symmetric versions of conventional amplifiers A and B) and an embodiment of a Doherty amplifier that includes a passive phase compensation circuit in the main amplifier path (e.g., a symmetric version of compensated amplifier C1/C2). In the "semi-optimized" embodiment of the compensated amplifier C1/C2 represented by these results, only the characteristic impedance, Zs, of the 90 degree short-circuited stub has been optimized, unlike with the results discussed in conjunction with FIG. 5. The system impedance, Ro, for the output circuit is fixed at 25 ohms. By determining and implementing an optimum characteristic impedance only for the short-circuited stub and not for the system impedance, it is possible that the full potential of the inventive subject matter may not be realized. Despite this, clear improvements may be observed, as described below and indicated in FIG. 6.

More specifically, plot 601 illustrates the AM-AM characteristics 611, 612, 613 (or transducer gain, "TD GAIN") for conventional amplifier A at about 1800 MHz, about 1990 MHz, and about 2170 MHz, respectively. Plot 602 illustrates the AM-AM characteristics 621, 622, 623 for conventional amplifier B at about 1800 MHz, about 1990 MHz, and about 2170 MHz, respectively. Finally, plot 603 illustrates the AM-AM characteristics 631, 632, 633 for a semi-optimized version of compensated amplifier C1/C2 at about 1800 MHz, about 1990 MHz, and about 2170 MHz, respectively.

In addition, plot 641 illustrates the AM-PM characteristics 651, 652, 653 (amplitude to phase conversion versus power out) for conventional amplifier A at about 1800 MHz, about 1990 MHz, and about 2170 MHz, respectively. Plot 642 illustrates the AM-PM characteristics 661, 662, 663 for conventional amplifier B at about 1800 MHz, about 1990 MHz, and about 2170 MHz, respectively. Finally, plot 643 illustrates the AM-PM characteristics 671, 672, 673 for an optimized compensated amplifier C1/C2 at about 1800 MHz, about 1990 MHz, and about 2170 MHz, respectively. Shown on the far right in FIG. 6 are values showing the peak power dispersion, Pdisp.

As can be seen from FIG. 6, the inclusion of an embodiment of a phase compensation circuit in a Doherty amplifier may result in a reduction of peak power dispersion. For example, a comparison of plots 601 and 603 indicates a reduction of peak power dispersion from about 1.04 dB for conventional amplifier A (i.e., about 57.65 dBm minus about 56.61 dBm in region 614) to about 0.50 dB (i.e., about 57.61 dBm minus about 57.11 dBm in region 634) for compensated amplifier C1/C2. This represents about 0.5 dB of improvement in utilization of such a wideband Doherty power amplifier.

Figure 7:
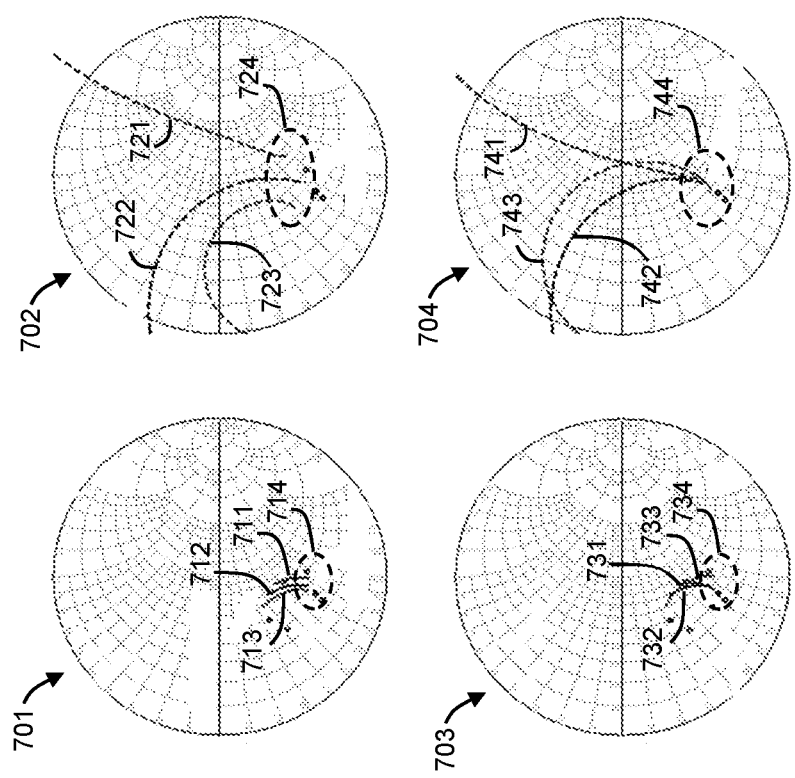
FIG. 7 includes Smith charts illustrating main and peaking load impedance trajectories versus power and frequency at the device package reference plane for a conventional Doherty amplifier and an embodiment of a Doherty amplifier that includes a passive phase compensation circuit.

FIG. 7 includes Smith charts illustrating main and peaking load impedance trajectories versus power and frequency at the device package reference plane (e.g., reference plane at the input to the output matching networks 238 and 248, FIGS. 2A, 2B) for conventional amplifier A and for compensated amplifier C1/C2 with Zs equal to 25 ohms. More specifically, the main load impedance trajectory for conventional amplifier A is shown in Smith chart 701, where traces 711, 712, 713 correspond to trajectories at 1800 MHz, 2000 MHz, and 2170 MHz, respectively, with the ends of the trajectories corresponding to the peak power condition converging into region 714. The peaking load impedance trajectory for conventional amplifier A is shown in Smith chart 702, where traces 721, 722, 723 correspond to trajectories at 1800 MHz, 2000 MHz, and 2170 MHz, respectively, with the ends of the trajectories corresponding to the peak power condition converging into region 724. For the compensated amplifier C1/C2, the main load impedance trajectory is shown in Smith chart 703, where traces 731, 732, 733 correspond to trajectories at 1800 MHz, 2000 MHz, and 2170 MHz, respectively, with the ends of the trajectories corresponding to the peak power condition converging into region 734. Finally, the peaking load impedance trajectory for compensated amplifier C1/C2 is shown in Smith chart 704, where traces 741, 742, 743 correspond to trajectories at 1800 MHz, 2000 MHz, and 2170 MHz, respectively, with the ends of the trajectories corresponding to the peak power condition converging into region 744.

In comparing Smith charts 701 and 703, it can be seen that compensated amplifier C1/C2 has a more favorable orientation of the frequency dispersion of the main load impedance in the high power region 734, when compared with the frequency dispersion of the main load impedance in the high power region 714 for conventional amplifier A. In addition, in comparing Smith charts 702 and 704, it can also be seen that compensated amplifier C1/C2 has a reduced impedance dispersion seen by the peaking device in the high power region 744, when compared with the impedance dispersion seen by the peaking device in the high power region 724 for conventional amplifier A.

Figure 8:
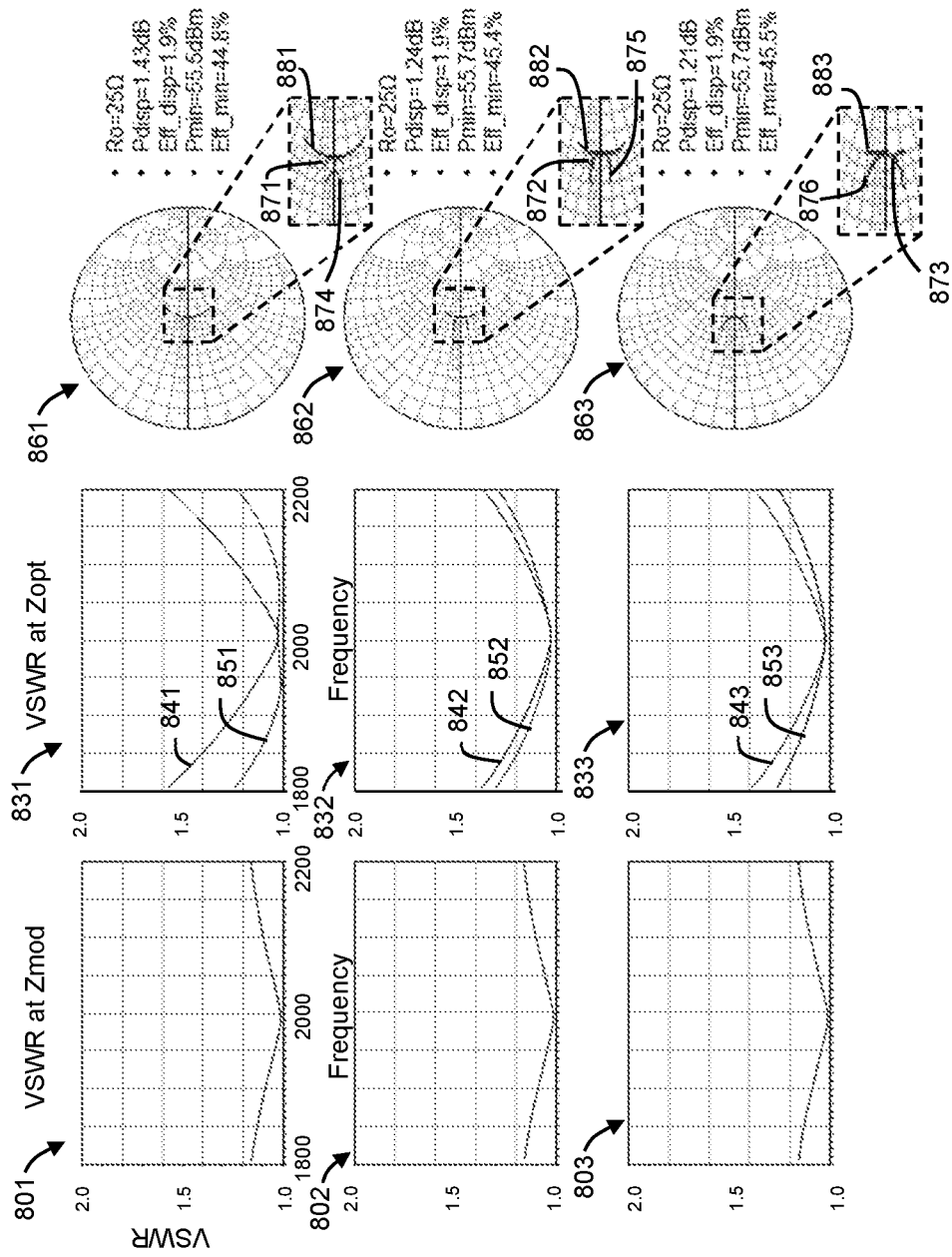
FIG. 8 includes plots and Smith charts illustrating main and peaking load characteristic at the intrinsic current generator reference plane for conventional Doherty amplifiers and an embodiment of a Doherty amplifier that includes a passive phase compensation circuit that includes a fixed system impedance.

FIG. 8 includes plots and Smith charts illustrating main and peaking load characteristic at the intrinsic current generator reference plane (e.g., reference plane 275, FIGS. 2A, 2B) for two conventional symmetric Doherty amplifiers (e.g., symmetric versions of conventional amplifiers A and B) and an embodiment of a Doherty amplifier that includes a passive phase compensation circuit in the main amplifier path (e.g., a symmetric version of compensated amplifier C1/C2). The illustrated plots and Smith charts in FIG. 8 more specifically show the resulting dispersion and calculated band-edge peak power and efficiency performance when the system impedance, Ro, for each of the amplifiers A, B, and C1/C2 is fixed at 25 ohms.

Figure 9:
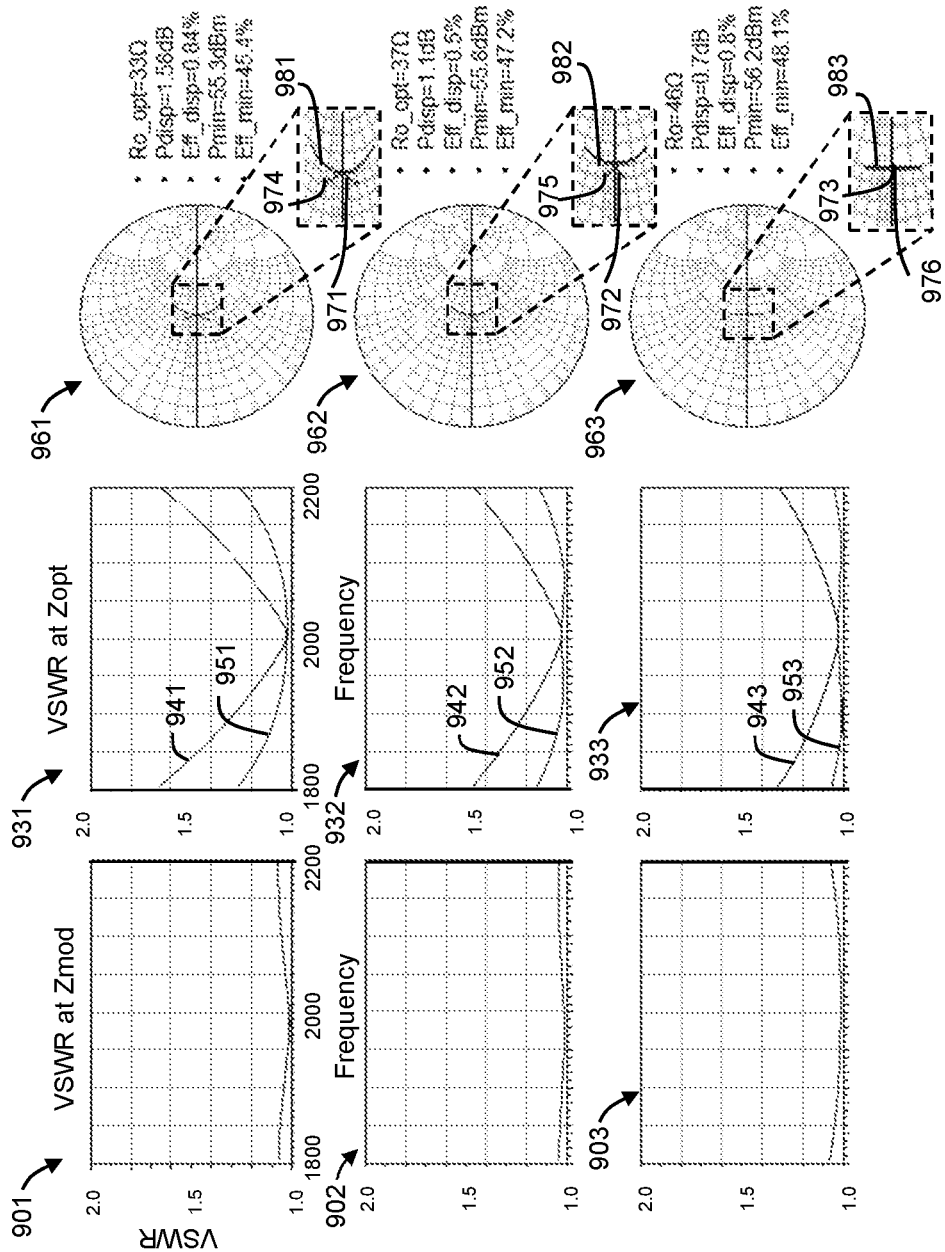
FIG. 9 includes plots and Smith charts illustrating main and peaking load characteristic at the intrinsic current generator reference plane for conventional Doherty amplifiers and an embodiment of a Doherty amplifier that includes a passive phase compensation circuit that includes an optimized system impedance.

FIG. 8 should be viewed simultaneously with FIG. 9, as a comparison of FIGS. 8 and 9 will underscore the beneficial effects that may be achieved when the system impedance, Ro, is optimized. More specifically, FIG. 9 includes plots and Smith charts for the same symmetric versions of amplifiers A and B and a symmetric version of compensated amplifier C1/C2 in which the system impedance, Ro, has been fully optimized to maximize the calculated band-edge efficiency performance.

More specifically, plots 801, 802, 803 illustrate the VSWR at Zmod over the simulated frequency range for conventional amplifier A, for conventional amplifier B, and for compensated amplifier C1/C2, respectively, with a fixed system impedance, Ro, at 25 Ohms. These amplifiers are referred to in the table, below, as amplifiers A1, B1, and C1/C2*, respectively. In addition, plots 831, 832, 833 illustrate main VSWR 841, 842, 843 and peaking VSWR 851, 852, 853 over the simulated frequency range for conventional amplifier A, for conventional amplifier B, and for compensated amplifier C1/C2, respectively, with a fixed system impedance, Ro, at 25 ohms. Finally, the corresponding load impedance dispersion characteristics are shown in Smith charts 861, 862, 863, where the main load reflection coefficient at Zmod is indicated with traces 871, 872, 873, the main load reflection coefficient at Zopt is indicated with traces 874, 875, 876, and the peaking load reflection coefficient at Zopt is indicated with traces 881, 882, 883, with a fixed system impedance, Ro, at 25 ohms. Shown on the far right in FIG. 8 are values representing the calculated peak power dispersion, Pdisp, the efficiency dispersion, Eff_Disp, the worst-case calculated peak power (minimum peak power) over the simulated frequency range, Pmin, and the worst-case calculated efficiency (minimum efficiency) over the simulated frequency range, Eff_min.

Similarly, plots 901, 902, 903 illustrate the VSWR at Zmod over the simulated frequency range for conventional amplifier A, for conventional amplifier B, and for compensated amplifier C1/C2, respectively, with an optimized system impedance, Ro. These amplifiers are referred to in the table, below, as amplifiers A2, B2, and C1/C2, respectively. In addition, plots 931, 932, 933 illustrate main VSWR 941, 942, 943 and peaking VSWR 951, 952, 953 over the simulated frequency range for conventional amplifier A, for conventional amplifier B, and for compensated amplifier C1/C2, respectively, with an optimized system impedance, Ro. Finally, the corresponding load impedance dispersion characteristics are shown in Smith charts 961, 962, 963, where the main load reflection coefficient at Zmod is indicated with traces 971, 972, 973, the main load reflection coefficient at Zopt is indicated with traces 974, 975, 976, and the peaking load reflection coefficient at Zopt is indicated with traces 981, 982, 983, with an optimized system impedance, Ro. Shown on the far right in FIG. 9** are values representing the calculated peak power dispersion, Pdisp, the efficiency dispersion, Eff_Disp, the worst-case calculated peak power (minimum peak power) over the simulated frequency range, Pmin, and the worst-case calculated efficiency (minimum efficiency) over the simulated frequency range, Eff_min.

The table, below, summarizes the results observed in FIGS. 8 and 9:

| | Amp A1 | Amp B1 | Amp C1/C2* | Amp A2 | Amp B2 | Amp C1/C2** |
|---|---|---|---|---|---|---|
| Ro (ohms) | 25 | 25 | 25 | 33 | 37 | 46 |
| Peak power disp. (dB) | 1.43 | 1.24 | 1.21 | 1.58 | 1.1 | 0.7 |
| Efficiency disp. (percent) | 1.9 | 1.9 | 1.9 | 0.84 | 0.5 | 0.8 |
| Min. peak power (dBm) | 55.5 | 55.7 | 55.7 | 55.3 | 55.8 | 56.2 |
| Min. efficiency (percent) | 44.8 | 45.4 | 45.5 | 45.4 | 47.2 | 48.1 |

As can be seen from a comparison of FIGS. 8 and 9, and as summarized in the above table, an embodiment of a Doherty amplifier with a compensation circuit and an optimized system impedance may provide the best overall performance, when compared with the other cases discussed above. In should be noted, however, that an embodiment of a Doherty amplifier with a compensation circuit and a fixed system impedance also shows some improvement, when compared with conventional amplifiers A and B (also with fixed system impedances). Accordingly, it may be desirable to optimize system impedance to yield an increased potential of implementing an embodiment of a compensation circuit into a Doherty amplifier. Furthermore, the results of FIGS. 8 and 9 again indicate that implementing an embodiment of a compensation circuit into a Doherty amplifier may have an added benefit of raising the optimum system impedance to a higher, more practical level, which in turn may enable a more convenient design and implementation on a relatively low-cost RF substrate.

An embodiment of a Doherty amplifier has a first amplifier path that includes a first amplifier, a second amplifier path that includes a second amplifier, a power divider, and a short-circuited stub. The power divider is configured to receive an RF signal and to divide the RF signal into first and second input signals. The power divider includes a first power divider output configured to produce the first input signal, and a second power divider output configured to produce the second input signal. The short-circuited stub is coupled between the first power divider output and the first amplifier or between the second power divider output and the second amplifier. The first amplifier path is characterized by a first frequency-dependent insertion phase, the second amplifier path is characterized by a second frequency-dependent insertion phase, and a slope of the first or second frequency-dependent insertion phase is altered by the short-circuited stub. According to a further embodiment, the power divider produces the first and second input signals with a quadrature phase shift.

Another embodiment of a Doherty amplifier includes a power divider, a main amplifier path, and a peaking amplifier path. The power divider is configured to receive an RF signal and to divide the RF signal into a main input signal and a peaking input signal. The power divider includes a first power divider output configured to produce the main input signal, and a second power divider output configured to produce the peaking input signal. The main amplifier path is coupled between the first power divider output and a combining node. The main amplifier path includes a main amplifier and first input circuitry coupled between the first power divider output and the main amplifier. The first input circuitry includes a short-circuited stub. The first input circuitry is characterized by a frequency-dependent insertion phase, and a slope of the frequency-dependent insertion phase is altered by the short-circuited stub. The peaking amplifier path is coupled between the second power divider output and the combining node. The peaking amplifier path includes a peaking amplifier and a series delay element coupled between the peaking amplifier and the combining node. According to a further embodiment, the power divider produces the first and second input signals with a quadrature phase shift.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Doherty amplifier comprising:
   a power divider configured to receive a radio frequency (RF) signal and to divide the RF signal into a main input signal and a peaking input signal, wherein the power divider includes a first power divider output configured to produce the main input signal, and a second power divider output configured to produce the peaking input signal, and wherein the power divider produces the main and peaking input signals with a quadrature phase shift;
   a main amplifier path coupled between the first power divider output and a combining node, wherein the main amplifier path includes a main amplifier and first input circuitry coupled between the first power divider output and the main amplifier, wherein the first input circuitry includes a first short-circuited stub, and wherein the first input circuitry is characterized by a frequency-dependent insertion phase, and a slope of the frequency-dependent insertion phase is altered by the first short-circuited stub; and
   a peaking amplifier path coupled between the second power divider output and the combining node, wherein the peaking amplifier path includes a peaking amplifier and a series delay element coupled between the peaking amplifier and the combining node.

2. The Doherty amplifier of claim 1, wherein the first short-circuited stub comprises:
   a 90 degree short-circuited stub coupled between the main amplifier path and a ground reference node.

3. The Doherty amplifier of claim 2, wherein the 90 degree short-circuited stub comprises a transmission line with a 90 degree electrical length.

4. The Doherty amplifier of claim 1, wherein the first short-circuited stub results in an over-compensation of a differential group delay by increasing a magnitude of the slope of the frequency-dependent insertion phase.

5. The Doherty amplifier of claim 4, wherein the first short-circuited stub increases the magnitude of the slope of the frequency-dependent insertion phase by at least 5 percent.

6. The Doherty amplifier of claim 1, wherein the power divider is a hybrid power splitter that includes an input and a port, wherein the input is configured to receive the RF signal, and the port is terminated.

7. The Doherty amplifier of claim 6, wherein the port is terminated with a 50 ohm termination to ground.

8. The Doherty amplifier of claim 1, further comprising:
   at least one additional short-circuited stub coupled to the peaking amplifier path.

9. The Doherty amplifier of claim 1, further comprising:
   at least one additional short-circuited stub coupled to the main amplifier path.

10. The Doherty amplifier of claim 1, further comprising:
    a first series delay element coupled to the main amplifier path between the first power divider output and the main amplifier; and
    a second series delay element coupled to the peaking amplifier path between the second power divider output and the peaking amplifier.

11. The Doherty amplifier of claim 1, wherein a characteristic impedance of the first short-circuited stub is in a range of 5 Ohms to 200 Ohms.

12. A Doherty amplifier comprising:
    a power divider configured to receive a radio frequency (RF) signal and to divide the RF signal into a main input signal and a peaking input signal, wherein the power divider includes a first power divider output configured to produce the main input signal, and a second power divider output configured to produce the peaking input signal, and wherein the power divider produces the main and peaking input signals with a quadrature phase shift;

a main amplifier path coupled between the first power divider output and a combining node, wherein the main amplifier path includes a main amplifier coupled between the first power divider output and the combining node; and a peaking amplifier path directly coupled to the second power divider output, and also coupled to the combining node, wherein the peaking amplifier path includes a peaking amplifier and a first short-circuited stub directly coupled to the peaking amplifier path, and wherein the peaking amplifier path is characterized by a frequency-dependent insertion phase, and a magnitude of a slope of the frequency-dependent insertion phase is decreased by the first short-circuited stub, which results in an under-compensation of a differential group delay.

13. The Doherty amplifier of claim 12, wherein the first short-circuited stub comprises:

a 90 degree short-circuited stub coupled between the peaking amplifier path and a ground reference node.

14. The Doherty amplifier of claim 13, wherein the 90 degree short-circuited stub comprises a transmission line with a 90 degree electrical length.

15. The Doherty amplifier of claim 12, wherein the first short-circuited stub decreases the magnitude of the slope of the frequency-dependent insertion phase by at least 5 percent.

16. The Doherty amplifier of claim 12, wherein the power divider is a hybrid power splitter that includes an input and a port, wherein the input is configured to receive the RF signal, and the port is terminated.

17. The Doherty amplifier of claim 12, further comprising:

at least one additional short-circuited stub coupled to the peaking amplifier path.

18. The Doherty amplifier of claim 12, further comprising:

at least one additional short-circuited stub coupled to the main amplifier path.

19. The Doherty amplifier of claim 12, further comprising:

a first series delay element coupled to the main amplifier path between the first power divider output and the main amplifier; and a second series delay element coupled to the peaking amplifier path between the second power divider output and the peaking amplifier.

20. The Doherty amplifier of claim 12, wherein a characteristic impedance of the first short-circuited stub is in a range of 5 Ohms to 200 Ohms.

* * * * *